(12) United States Patent
Ikeda

(10) Patent No.: US 6,839,470 B2
(45) Date of Patent: Jan. 4, 2005

(54) PATTERN EVALUATION METHOD, PATTERN EVALUATION SYSTEM AND COMPUTER READABLE RECORDED MEDIUM

(75) Inventor: Takahiro Ikeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 610 days.

(21) Appl. No.: 09/991,916

(22) Filed: Nov. 26, 2001

(65) Prior Publication Data

US 2002/0097913 A1 Jul. 25, 2002

(30) Foreign Application Priority Data

Jan. 27, 2000 (JP) ........................................ 2000-360157

(51) Int. Cl.[7] ................................................. G06K 9/40
(52) U.S. Cl. ....................... 382/266; 382/145; 382/269; 382/275; 356/16; 358/3.26; 358/3.27
(58) Field of Search ................................ 382/141, 145, 382/147, 266, 269, 275; 356/16, 22, 622, 639; 358/3.26, 3.27, 463

(56) References Cited

U.S. PATENT DOCUMENTS 5,386,294 A * 1/1995 Ototake et al. ............. 356/401
5,481,360 A * 1/1996 Fujita ........................ 356/489
6,613,593 B2 * 9/2003 Tanaka et al. ................. 438/16
6,614,923 B1 * 9/2003 Shishido et al. ............ 382/149
6,668,075 B1 * 12/2003 Nakamura et al. .......... 382/144

FOREIGN PATENT DOCUMENTS

| JP | 11-257940 | 9/1999 |
| JP | 2000-58410 | 2/2000 |

* cited by examiner

Primary Examiner—Bhavesh M. Mehta
Assistant Examiner—Yosef Kassa
(74) Attorney, Agent, or Firm—Finnegan, Henderson, Farabow, Garrett & Dunner, L.L.P.

(57) ABSTRACT

A pattern evaluation method includes: scanning an object to be measured on which a pattern has been formed with an energy beam and obtaining an image data of the object by detecting a scattered particle which is produced from the object; recognizing at least one edge of the pattern on the basis of the image data and calculating the coordinate positions of each edge point of a sequence of edge points constituting the shape of the edge of the pattern; deriving a straight line so that the sum of lengths of perpendiculars drawn from the edge points to the straight line is minimum; and statistically processing the lengths of perpendiculars when the straight line is derived and outputting evaluation information for quantitatively expressing roughness of the edge of the pattern.

36 Claims, 17 Drawing Sheets

($y_{IIav} - y_{Iav}$ IS MAXIMUM)

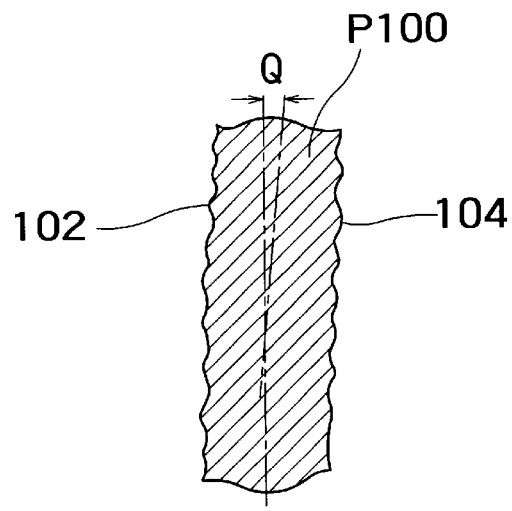 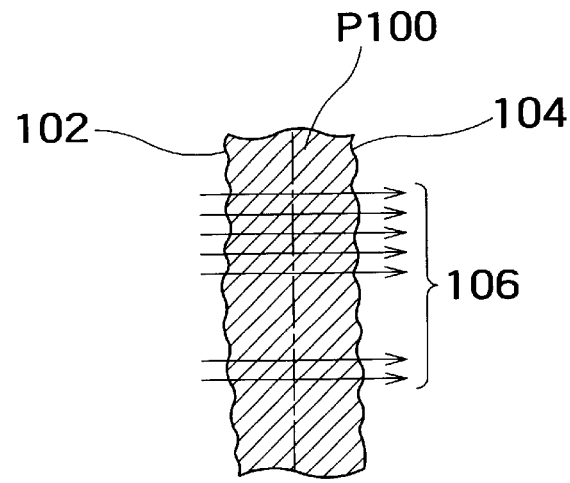
FIG. 25A    FIG. 25B
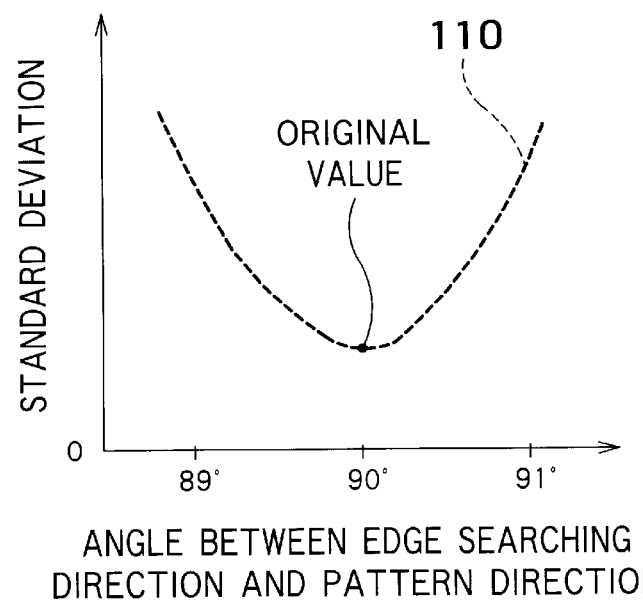
FIG. 26

PATTERN EVALUATION METHOD, PATTERN EVALUATION SYSTEM AND COMPUTER READABLE RECORDED MEDIUM

CROSS REFERENCE TO RELATED APPLICATION

This application claims the benefit of priority from the prior Japanese Patent Application No. 2000-360157, filed on Nov. 27, 2000, the entire contents of which are incorporated herein by reference.

BACKGROUND OF THE INVENTION

1. Field of the Invention

The present invention generally relates to a pattern evaluation method, a pattern evaluation system and a computer-readable recorded medium. More specifically, the invention relates to the evaluation of edge roughness of a fine pattern in a semiconductor fabricating process.

2. Description of the Prior Art

In a process for fabricating a semiconductor designed in fine patterns, it is important to precisely evaluate the variation in pattern dimension. As the variation in pattern dimension, there is a problem in the fluctuation in dimension every production lot or semiconductor chip. In particular, the local fluctuation in dimension in one pattern also deteriorates device characteristics. For that reason, in recent years, it becomes much more important to quantitatively evaluate such a local fluctuation. In particular, the fluctuation in dimension wherein the position of a pattern edge finely fluctuates in a local area of tens nanometers through several nanometers is called "edge roughness", and mainly occurs in a lithography process which is carried out when a pattern is produced and in an etching process which is subsequently carried.

Conventionally, as methods for evaluating edge roughness, methods for observing a fine pattern by means of an observing device using a scanning probe, such as a scanning electron microscope (which will be hereinafter referred to as SEM) or an atomic force microscope (which will be hereinafter referred to as AFM) in order to obtain the dimension of a pattern width to quantify its local fluctuation have been widely used.

In the method using AFM of these methods, there is a problem in that it is not possible to obtain a resolution of several nanometers required to observe pattern edges since the diameter of the tip end of the probe is large.

On the other hand, in a conventional method using SEM having a high edge resolution of several nanometers, edge roughness has been quantified on the basis of the variance in a plurality of measured values after the measurement of the line width of linear patterns at a plurality of places. However, according to this method, when a portion wherein the coordinates of an edge stochastically fluctuate in the same direction exists as shown in, e.g., a portion R100 in FIG. 24, such a portion is relatively small as the fluctuation in line width, so that there is a problem in that roughness is underestimated.

In addition, in the prior art, as the preparation of evaluation, a linear pattern is first displayed on an image display part of an observing device as a pattern P100 shown in FIG. 25A, and then, the pattern P100 are positioned so that the longitudinal directions thereof corresponds to horizontal or vertical directions in a measuring region as far as possible as shown in FIG. 25B. Thereafter, the pattern edge is searched out in horizontal directions 106 or vertical directions in the measuring region, and then, edge roughness is calculated as a residual from the means position of edge positions by, e.g., the standard deviation or mean deviation.

However, in order to carry out a positioning for causing the direction of the pattern edge to precisely arranged perpendicular to the edge searching direction, it is usually required to carry out a troublesome processing. In addition, the edge searching direction is frequently slightly shifted from a direction perpendicular to the longitudinal directions of the pattern. In such a case, there are some cases where a far greater value than that when the directions are completely perpendicular to each other is calculated. FIG. 26 is a graph illustrating errors in such a case. For example, as shown in broken line 110 in this figure, even if the direction of the pattern slightly rotates by about 0.5° there are some cases where the value of rms representing a roughness value is calculated to be twice or more as much as the proper value.

In addition, in a photo mask pattern used in a lithography process, there are some cases where stitching errors are caused depending on a mask pattern writing method. Such stitching errors should be distinguished from edge roughness which is caused by a resist material, a resist process or an etching process. However, both can not be separated to be determined by conventional evaluation methods.

As a method for solving the above described problems in the prior art, Japanese Patent Laid-Open No. 11-257940 (which will be hereinafter referred to as a document) has proposed a method for quantifying roughness on the basis of the σ value of a normal distribution, the normal distribution being acquired by preparing a histogram with respect to the position of a pattern edge to approximate the histogram.

However, according to the method described in the above described document, a measuring step further includes a calculating step of approximating the histogram to the normal distribution as well as a step of preparing the histogram, so that it takes a lot of time to calculate a roughness value. In addition, the distribution of the edge positions is often shifted from the normal distribution. In this case, it is improper to quantify roughness on the basis of the above described σ value. Furthermore, in the above described document, as a method for removing the stitching errors and as a method for removing a fine rotational component in an object to be measured, there is proposed a method for referring to the central position of the pattern to remove its fluctuation components from the fluctuation components of the coordinates of the edge. However, it is impossible to use this method if the edges on both sides of the pattern are not included in a region to be measured.

Moreover, in conventional pattern evaluation systems, edge roughness is only numerically expressed by a standard deviation, a mean deviation or a difference between the maximum and minimum values of a line width, and it is not possible to visually and immediately obtain information as to how roughness exists at any position of a pattern to be evaluated, so that it is very difficult for the observer to grasp the spatial distribution of roughness and the difference in shape.

SUMMARY OF THE INVENTION

According to a first aspect of the invention, there is provided a pattern evaluation method comprising: scanning an object to be measured on which a pattern has been formed with an energy beam and obtaining an image data of the object by detecting a scattered particle which is produced from the object; recognizing at least one edge of the pattern on the basis of the image data and calculating the coordinate positions of each edge point of a sequence of edge points constituting the shape of the edge of the pattern; deriving a straight line so that the sum of lengths of perpendiculars drawn from the edge points to the straight line is minimum; and statistically processing the lengths of perpendiculars when the straight line is derived and outputting evaluation information for quantitatively expressing roughness of the edge of the pattern.

According to a second aspect of the invention, there is provided a pattern evaluation method comprising: scanning an object to be measured on which a pattern has been formed with an energy beam and obtaining an image data of the object by detecting a scattered particle which is produced from the object; recognizing at least one edge of the pattern on the basis of the image data and calculating the coordinate positions of each edge point of a sequence of edge points constituting the shape of the edge of the pattern; dividing the sequence of edge points into two groups by an optional point in the sequence of edge points to identify an edge point at which a stitching error may occur by a discriminant analysis method in a multivariate analysis; calculating a mean position of the edge points in each of the groups and a residual from the mean position for each of the groups divided by the identified edge point; and statistically processing the residue and outputting evaluation information for quantitatively expressing roughness of the edge of the pattern.

According to a third aspect of the invention, there is provided a pattern evaluation method comprising: scanning an object to be measured on which a pattern has been formed with an energy beam and obtaining and incorporate an image data of the object by detecting a scattered particle which is produced from the object; recognizing at least one edge of the pattern on the basis of the image data and calculating the coordinate positions of each edge point of a sequence of edge points constituting the shape of the edge of the pattern; dividing the sequence of edge points into two groups by an optional point in the sequence of edge points to derive a straight line for each of the groups so that the sum of lengths of perpendiculars drawn from the edge points to the straight line is minimum to calculate the distance between the straight lines and identifying the optional point at which the distance between the straight lines is minimum as an edge point at which a stitching error may occur; calculating a length of a perpendicular which is drawn from each of the edge points to the straight line for each of the groups when the edge point at which a stitching error may occur is identified; and statistically processing the lengths of perpendiculars for each of the groups and outputting evaluation information for quantitatively expressing roughness of the edge of the pattern.

According to a fourth aspect of the invention, there is provided a pattern evaluation method comprising: scanning an object to be measured on which a pattern has been formed with an energy beam and obtaining an image data of the object by detecting a scattered particle which is produced from the object; recognizing at least one edge of the pattern on the basis of the image data, and calculating the coordinate positions of each edge point of a sequence of edge points constituting the shape of the edge of the pattern; deriving a function on the basis of the coordinate positions, the function being approximate to the sequence of edge points and being expressed by a linear combination of a Boltzmann function and a linear function; dividing the sequence of edge points into first and second groups by a point of inflection of the function to calculate the length of a perpendicular drawn from each of the edge points to a curve which is a locus of the function for each of the first and second groups; and statistically processing the length of the perpendicular to output evaluation information for quantitatively expressing roughness of the edge of the pattern.

According to a fifth aspect of the invention, there is provided a pattern evaluation system comprising: an image data acquiring part which scans an object to be measured on which a pattern has been formed with an energy beam, detects a scattered particle which is produced from the object and acquires an image data including at least one pattern edge; an operator part which recognizes the pattern edge on the basis of the image data, calculates the coordinate position of each of edge points of a sequence of edge points constituting the shape of the pattern edge, derives a straight line so that the sum of lengths of perpendiculars drawn from the edge points to the straight line is minimum and outputs the lengths of the perpendiculars when the straight line is obtained; and a statistically processing part which statistically processes the lengths of the perpendiculars when the straight line is obtain and outputs evaluation information for quantitatively expressing roughness of the pattern edge.

According to a sixth aspect of the invention, there is provided a pattern evaluation system comprising: an image data acquiring part which scans an object to be measured on which a pattern has been formed with an energy beam, detects a scattered particle which is produced from the object and acquires an image data including at least one pattern edge; an operator part which recognizes the pattern edge on the basis of the image data, calculates the coordinate position of a sequence of edge points constituting the shape of the pattern edge, divides the sequence of edge points into two groups by an optional point in the sequence of edge points to identify an edge point at which a stitching error may occur by a discriminant analysis method in a multivariate analysis and calculates a mean position of the edge points in each of the groups and a residual from the means position for each of groups divided by the identified edge point; and a statistically processing part which statistically processes the residue to output evaluation information for quantitatively expressing roughness of the pattern edge.

According to a seventh aspect of the invention, there is provided a pattern evaluation system comprising: an image data acquiring part which scans an object to be measured on which a pattern has been formed with an energy beam, detects a scattered particle which is produced from the object and acquires an image data including at least one pattern edge; an operator part which recognizes the pattern edge on the basis of the image data, calculates the coordinate position of a sequence of edge points constituting the shape of the pattern edge, divides the sequence of edge points into two groups at an optional point in the sequence of edge points to derive a straight line for each of the groups so that the sum of lengths of perpendiculars drawn from the edge points to the straight line is minimum to calculate the distance between the straight lines, identifies an optional point at which the distance is minimum as an edge point which a stitching error may occur and calculates a length of a perpendicular which is drawn from each of the edge points to the straight line for each of the groups when the edge point at which the stitching error may occur is identified; and a statistically processing part which statistically processes the lengths of perpendiculars for each of the groups and outputs evaluation information for quantitatively expressing roughness of the pattern edge.

According to an eighth aspect of the invention, there is provided a pattern evaluation system comprising: an image data acquiring part which scans an object to be measured on which a pattern has been formed with an energy beam, detects a scattered particle which is produced from the object and acquires an image data including at least one pattern edge; an operator part which recognizes the pattern edge on the basis of the image data, calculates the coordinate position of a sequence of edge points constituting the shape of the pattern edge, derives a function on the basis of the coordinate positions, the function being approximate to the sequence of edge points and expressed by a linear combination of a Boltzmann function and a linear function, divides the sequence of edge points into first and second groups by a point of inflection of the function and calculates the length of a perpendicular which is drawn from each of the edge points to a curve which is a locus of the function for each of the first and second groups; and a statistically processing part which statistically processes the length of the perpendicular and outputs evaluation information for quantitatively expressing roughness of the pattern edge.

According to a ninth aspect of the invention, there is provided a computer readable recorded medium for use in a pattern evaluation system having a computer which receives and processes an image data acquired by scanning an object to be measured on which a pattern has been formed with an energy beam and by detecting a scattered particle which is produced from the object, the medium having recorded a program for causing the computer to execute a pattern evaluation method, the method comprising: recognizing at least one edge of the pattern on the basis of the image data and calculating the coordinate positions of each edge point of a sequence of edge points constituting the shape of the edge of the pattern; deriving a straight line so that the sum of lengths of perpendiculars drawn from the edge points to the straight line is minimum; and statistically processing the lengths of perpendiculars when the straight line is derived and outputting evaluation information for quantitatively expressing roughness of the edge of the pattern.

According to a tenth aspect of the invention, there is provided a computer readable recorded medium for use in a computer which receives and processes an image data acquired by scanning an object to be measured on which a pattern has been formed with an energy beam and by detecting a scattered particle which is produced from the object, the medium having recorded a program for causing the computer to execute a pattern evaluation method, the method comprising: recognizing at least one edge of the pattern on the basis of the image data and calculating the coordinate positions of each edge point of a sequence of edge points constituting the shape of the edge of the pattern; dividing the sequence of edge points into two groups by an optional point in the sequence of edge points to identify an edge point at which a stitching error may occur by a discriminant analysis method in a multivariate analysis; calculating a mean position of the edge points in each of the groups and a residual from the mean position for each of the groups divided by the identified edge point; and statistically processing the residue and outputting evaluation information for quantitatively expressing roughness of the edge of the pattern.

According to an eleventh aspect of the invention, there is provided a computer readable recorded medium for use in a computer which receives and processes an image data acquired by scanning an object to be measured on which a pattern has been formed with an energy beam and by detecting a scattered particle which is produced from the object, the medium having recorded a program for causing the computer to execute a pattern evaluation method, the method comprising: recognizing at least one edge of the pattern on the basis of the image data and calculating the coordinate positions of each edge point of a sequence of edge points constituting the shape of the edge of the pattern; dividing the sequence of edge points into two groups by an optional point in the sequence of edge points to derive a straight line for each of the groups so that the sum of lengths of perpendiculars drawn from the edge points to the straight line is minimum to calculate the distance between the straight lines and identifying the optional point at which the distance between the straight lines is minimum as an edge point at which a stitching error may occur; calculating a length of a perpendicular which is drawn from each of the edge points to the straight line for each of the groups when the edge point at which a stitching error may occur is identified; and statistically processing the lengths of perpendiculars for each of the groups and outputting evaluation information for quantitatively expressing roughness of the edge of the pattern.

According to a twelfth aspect of the invention, there is provided a computer readable recorded medium for use in a computer which receives and processes an image data acquired by scanning an object to be measured on which a pattern has been formed with an energy beam and by detecting a scattered particle which is produced from the object, the medium having recorded a program for causing the computer to execute a pattern evaluation method, the method comprising: recognizing at least one edge of the pattern on the basis of the image data, and calculating the coordinate positions of each edge point of a sequence of edge points constituting the shape of the edge of the pattern; deriving a function on the basis of the coordinate positions, the function being approximate to the sequence of edge points and being expressed by a linear combination of a Boltzmann function and a linear function; dividing the sequence of edge points into first and second groups by the point of inflection of the function to calculate the length of a perpendicular drawn from each of the edge points to a curve which is a locus of the function for each of the first and second groups; and statistically processing the length of the perpendicular to output evaluation information for quantitatively expressing roughness of the edge of the pattern.

BRIEF DESCRIPTION OF THE DRAWINGS

In the drawings:

FIGS. 25A and 25B are illustrations for explaining another problem in the conventional pattern evaluation method; and FIG. 26 is a graph for explaining a further problem in the conventional pattern evaluation method.

DETAILED DESCRIPTION OF THE INVENTION

Referring now to the accompanying drawings, some embodiments of the present invention will be described below. The embodiments for evaluating a pattern of a photoresist using a SEM will be described below.

(1) Embodiment of Pattern Evaluation System

Figure 1:
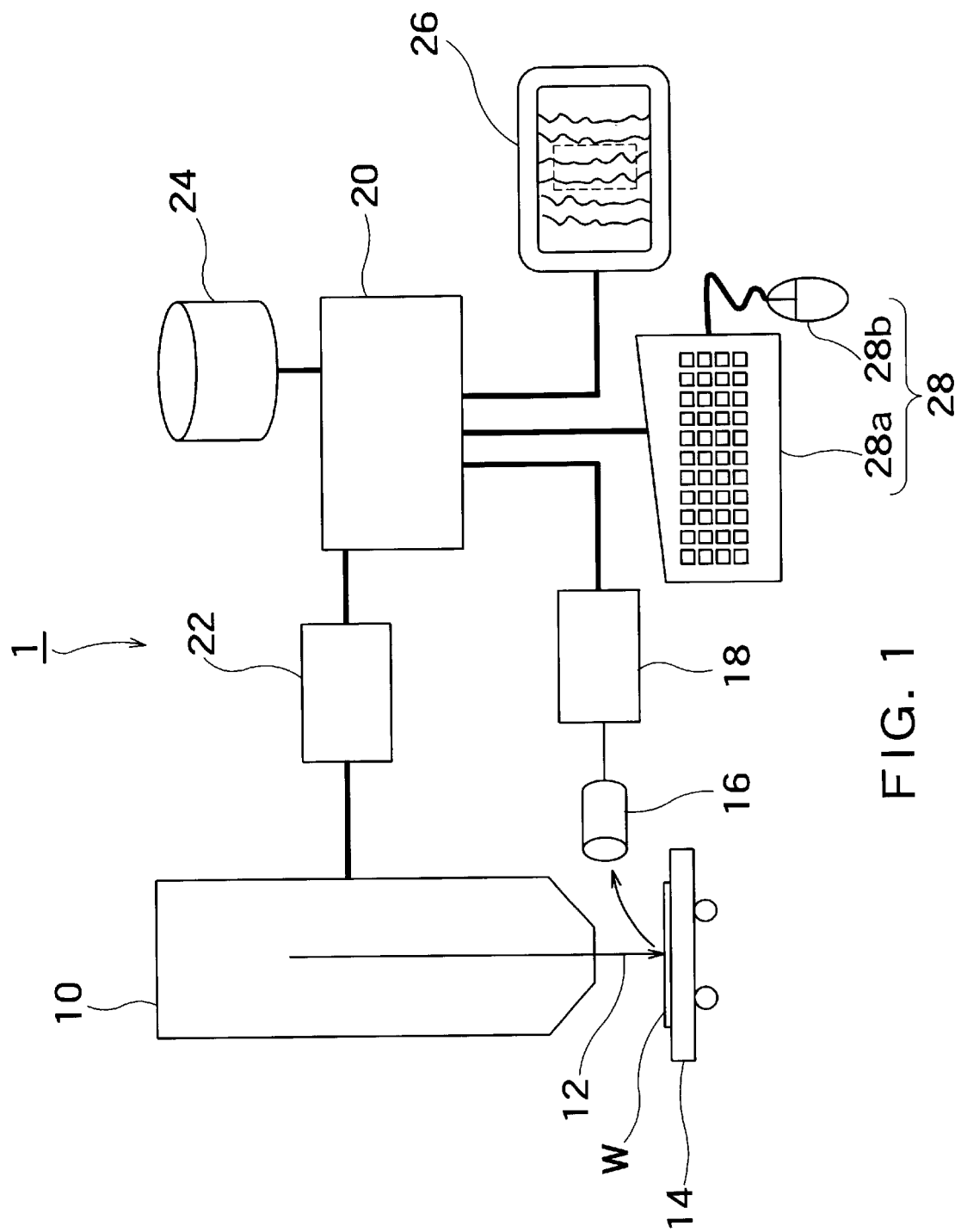
FIG. 1 is a block diagram showing a schematic construction of an embodiment of a pattern evaluation system according to the present invention.

FIG. 1 is a block diagram showing a schematic construction of an embodiment of a pattern evaluation system according to the present invention. The pattern evaluation system 1 shown in this FIG. comprises an electron optical system 10, an electron optical system control part 22, a stage 14, a secondary electron signal detector 16, a signal amplifying part 18, a control computer 20, a memory 24, a CRT (Cathode Ray Tube) 26 and an input unit 28. The memory 24 stores there in an evaluation recipe including a program in which the respective procedures in an embodiment of a pattern evaluation method according to the present invention which will be described later are described. The memory 24 is connected to the control computer 20. The evaluation recipe is read into the control computer 20 on the basis of its command. In this embodiment, the control computer 20 executes the evaluation of a pattern (which will be suitably hereinafter referred to as a "photoresist pattern") which is formed on a photoresist on a wafer W in accordance with the evaluation recipe which is read out of the memory 24. The electron optical system 12 is connected to the control computer 20 via the electron optical system control part 22 and is designed to cause electron beams 12 to be emitted from an electron gun (not shown) to scan a measuring region of the wafer W mounted on the stage 14 with the electron beams 12. The secondary electron signal detector 16 is connected to the control computer 20 via the signal amplifying part 18. The input unit 28 includes a keyboard 28a and a mouse 28b and is connected to the control computer 20 for supplying data required to execute an evaluation process. The CRT 26 is connected to the control computer 20 for displaying an image data, which is supplied from the control computer 20, as an observable image.

Referring to the accompanying drawings, as embodiments of a pattern evaluation method according to the present invention, the operation of the pattern evaluation system 1 shown in FIG. 1 will be described below.

(2) First Embodiment of Pattern Evaluation Method

Figure 2:
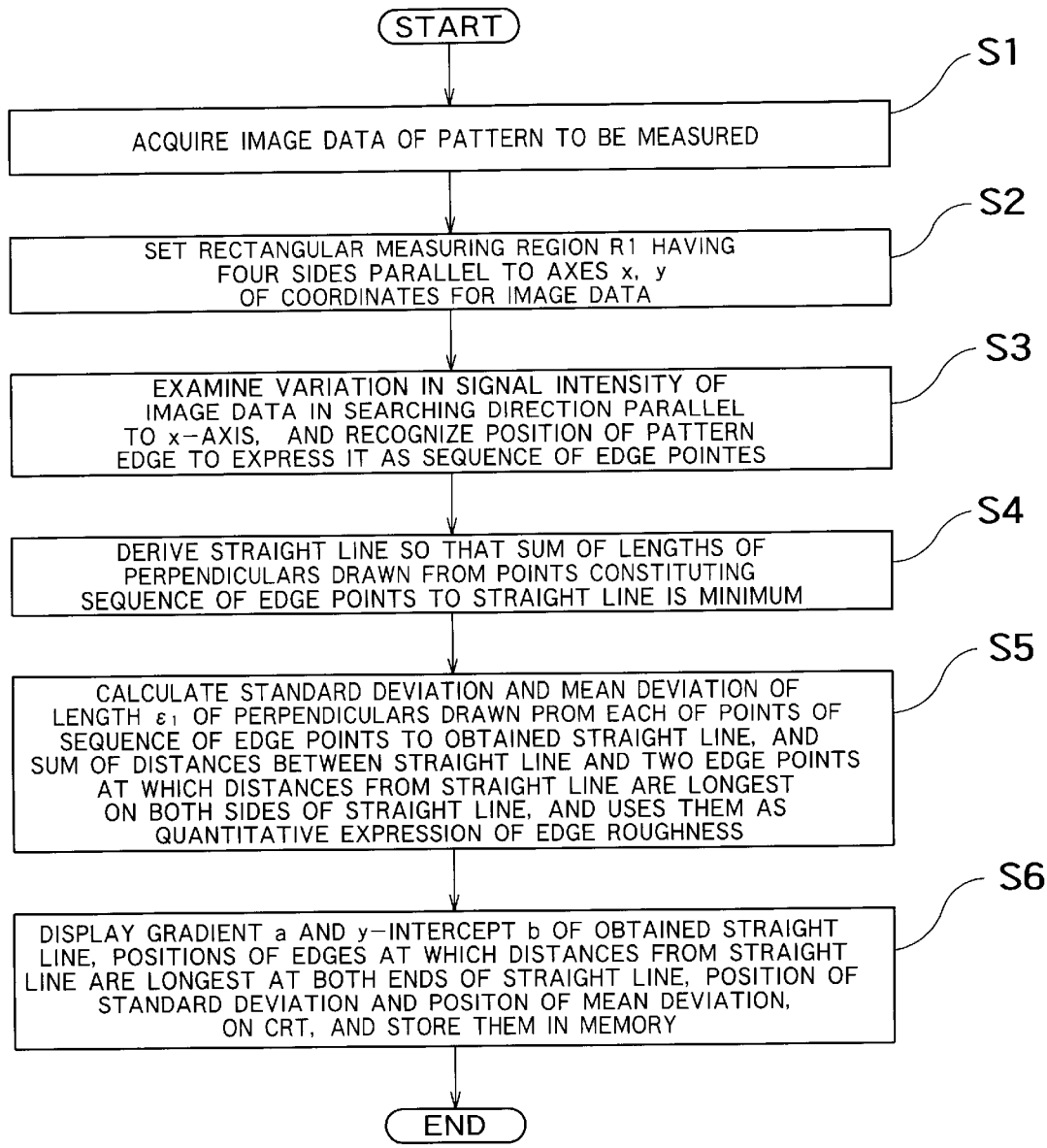
FIG. 2 is a flow chart showing a schematic procedure in a first embodiment of a pattern evaluation method according to the present invention.
Figure 3:
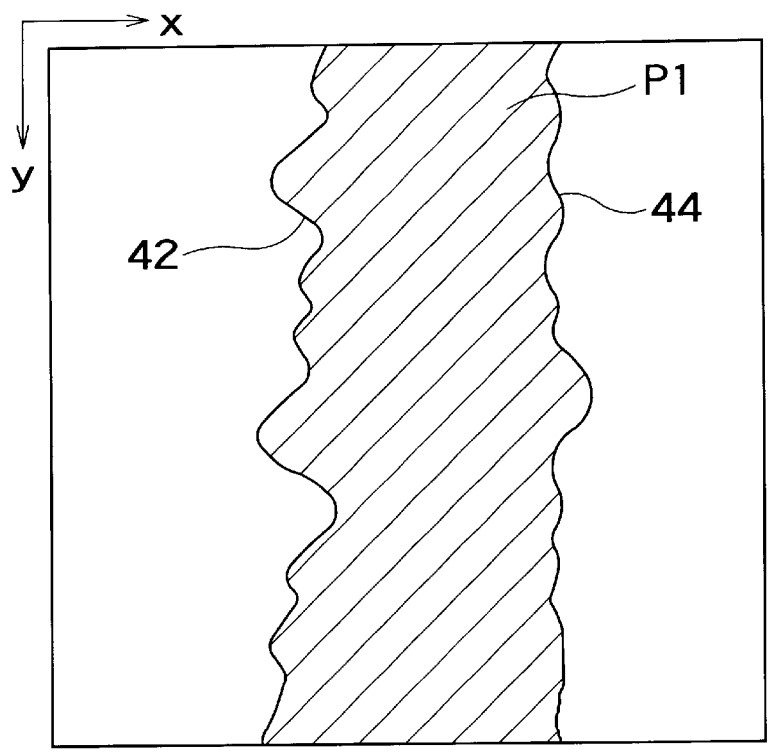
FIG. 3 is an illustration showing an example of an image data of a pattern to be measured, which is acquired by the procedure shown in FIG. 2 and which is displayed on a CRT.

FIG. 2 is a flow chart showing a schematic procedure in the pattern evaluation method in this embodiment. As shown in this figure, an image data of a photoresist pattern to be measured is first acquired (step S1). Specifically, a semiconductor wafer W, on which a pattern to be measured has been formed, is carried in to be mounted on the top face of the stage 14 to be positioned and a region including the pattern to be measured is scanned with the electron beams 12. Since secondary electrons, reflected electrons and back-scattered electrons (which will be hereinafter referred to as secondary electrons and so forth) are emitted from the surface of the semiconductor wafer W, the secondary electron signal detector 16 detects the secondary electrons and so forth to acquire a secondary electron signal. The secondary electron signal is amplified by the signal amplifier 18 to be supplied to the control computer 20. The control computer 20 converts the amplified secondary electron signal into an image data to store it in the memory 24 and to display it on the CRT 26. An example of an image data of a pattern P1 to be measured, which is thus acquired and displayed, is shown in FIG. 3.

Figure 4:
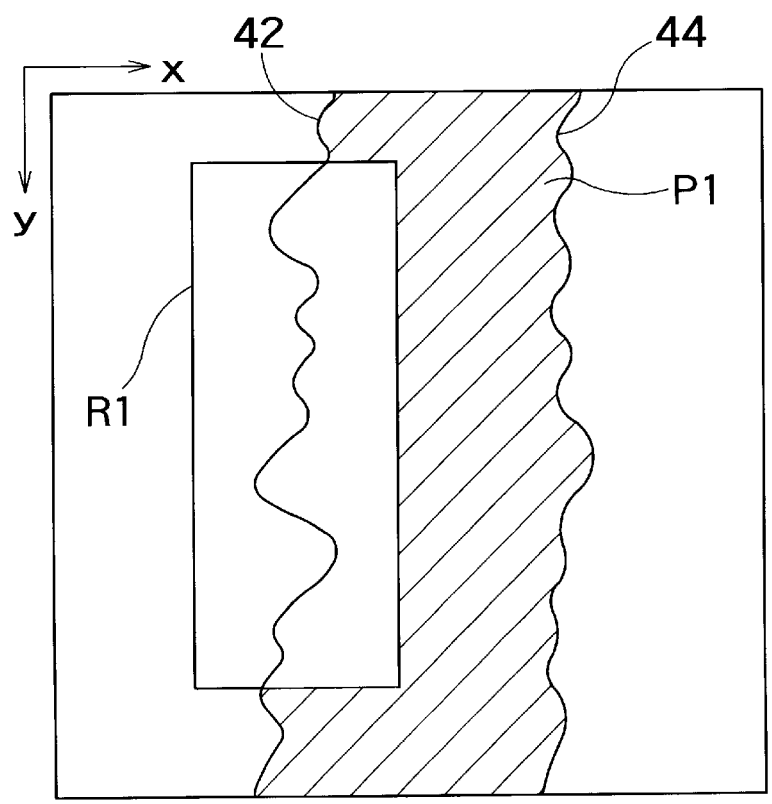
FIG. 4 is an illustration showing an example of a rectangular measuring region which is set with respect to the image data acquired by the procedure shown in FIG. 2.

Then, as shown in FIG. 4, a rectangular measuring region R1 is set with respect to the acquired image data (step S2). In this embodiment, the measuring region R1 is a region surrounded by four sides having the same directional components as the coordinate axes x and y of the orthogonal coordinate system in which the pixels of the image data are arranged.

Figure 5:
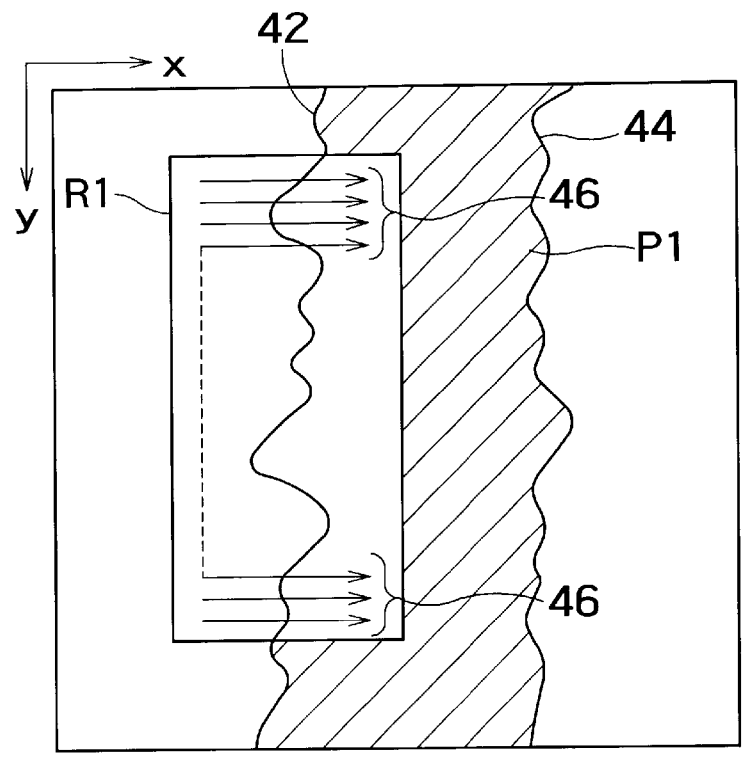
FIG. 5 is an illustration showing a searching direction for recognizing the position of a pattern edge of the pattern to be measured on the basis of the image data acquired by the procedure shown in FIG. 2.

Then, as shown in FIG. 5, the variation in signal intensity of the image data is examined in a searching direction 46 which is parallel to x-axis, and thus, the position of a pattern edge 42 of the pattern P1 to be measured is recognized by calculating it with respect to a plurality of positions in y-axis (step S3).

The recognition of the position of the edge is carried out by, e.g., the threshold method which has been conventionally widely used. As a threshold, a value of 50% corresponding to a mean value of the maximum and minimum values of the signal intensities of the respective image data is used.

A sequence of edge points thus obtained is expressed by Pi(xi, yi) (i=1, 2, ..., n (n is the total number of edge points)).

Then, a straight line is derived so that the sum of the lengths of perpendiculars drawn from the respective points (xi, yi) constituting the sequence of edge points Pi to the straight line is minimum (step S4). The equation of the straight line is calculated as follows.

That is, assuming that the gradient of the straight line is a and the value of y-intercept is b, a and b are calculated by the following expressions using the coordinates (xi, yi) of the row Pi of edge points.

$$a = \frac{\left(-B \pm \sqrt{B^2 + 4A^2}\right)}{2A} \quad (1)$$

$$b = \frac{\sum_{i=1}^{N} yi}{N} - a\frac{\sum_{i=1}^{N} xi}{N} \quad (2)$$

wherein $$A = \sum_{i=1}^{N} xi \sum_{i=1}^{N} yi - N \sum_{i=1}^{N} xiyi \quad (3)$$

$$B = \left(\left(\sum_{i=1}^{N} xi\right)^2 - N \sum_{i=1}^{N} xi^2\right) - \left(\left(\sum_{i=1}^{N} yi\right)^2 - N \sum_{i=1}^{N} yi^2\right) \quad (4)$$

Two values are calculated as the value of a by decoding expression (1). One value of them gives a straight line which makes the sum of squares of perpendiculars drawn from the respective points of the sequence of edge points to the straight line minimum, and the other value gives a straight line which is perpendicular to the straight line given by the one value. Therefore, after the calculation based on the above described expressions (1) through (4), the sum of squares of the perpendicular drawn from the respective straight lines to the respective edge points is calculated again, and the value of a giving a smaller sum of squares is adopted as the gradient of a straight line to be obtained. In this case, the length $\epsilon$ i of the perpendicular is given by the following expression.

$$\epsilon i^2 = \frac{\sum_{i=1}^{N} (yi - axi - b)^2}{1 + a^2} \quad (5)$$

Then, the standard deviation and the mean deviation of the values of $\epsilon$ i given by expression (5) are calculated respectively, edge positions at which the distance from the straight line is longest on both sides of the straight line are searched out to calculate the sum of distances between the two points and the straight line and the standard deviation, the mean deviation and the edge positions are adopted as a quantitative expression of edge roughness (step S5).

Finally, the gradient a and y-intercept b of the straight line, the position of the edge at which the distance from the straight line is longest on both sides of the straight line, the position of the standard deviation, and the position of the mean deviation, which are thus obtained, are displayed on the CRT 26 and stored in the memory 24 (step S6).

Figure 6:
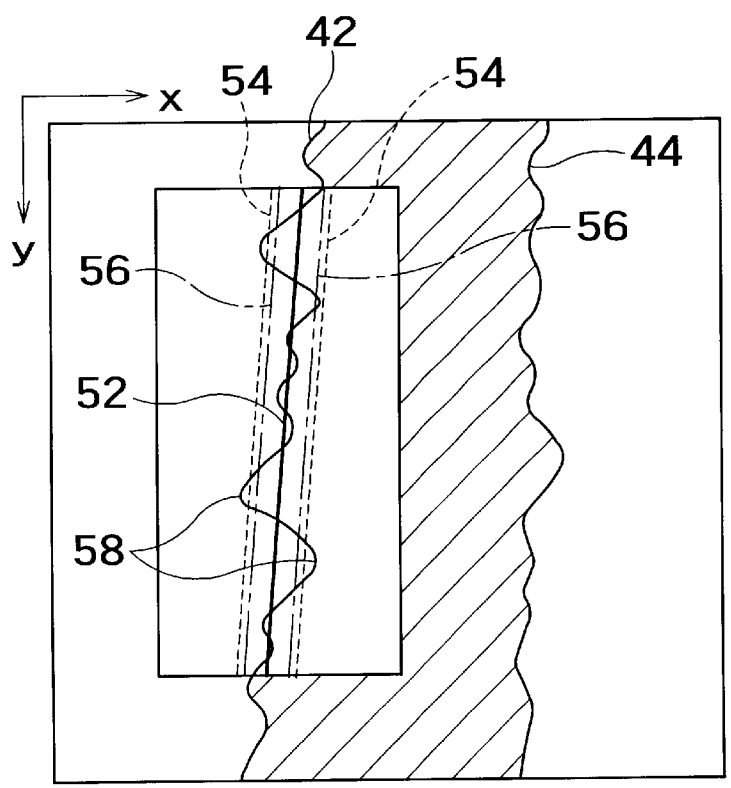
FIG. 6 is an illustration showing an example wherein a quantitative expression obtained by the procedure shown in FIG. 2 is displayed on a CRT.

FIG. 6 shows a concrete example wherein the quantitative expression obtained by the above described procedure is displayed on the CRT 26. In this figure, the straight line 52 shown by the solid line is a straight line wherein the sum of lengths of perpendiculars drawn from the respective points of the sequence of edge points is minimum. In addition, the straight line 54 illustrated by the dotted line shows the position of the standard deviation, and the straight line 56 illustrated by the chain line shows the position of the mean deviation. Furthermore, the two edge points 58 are edge positions at which the distance from the straight line 52 is longest on both sides of the straight line 52.

Figure 7:
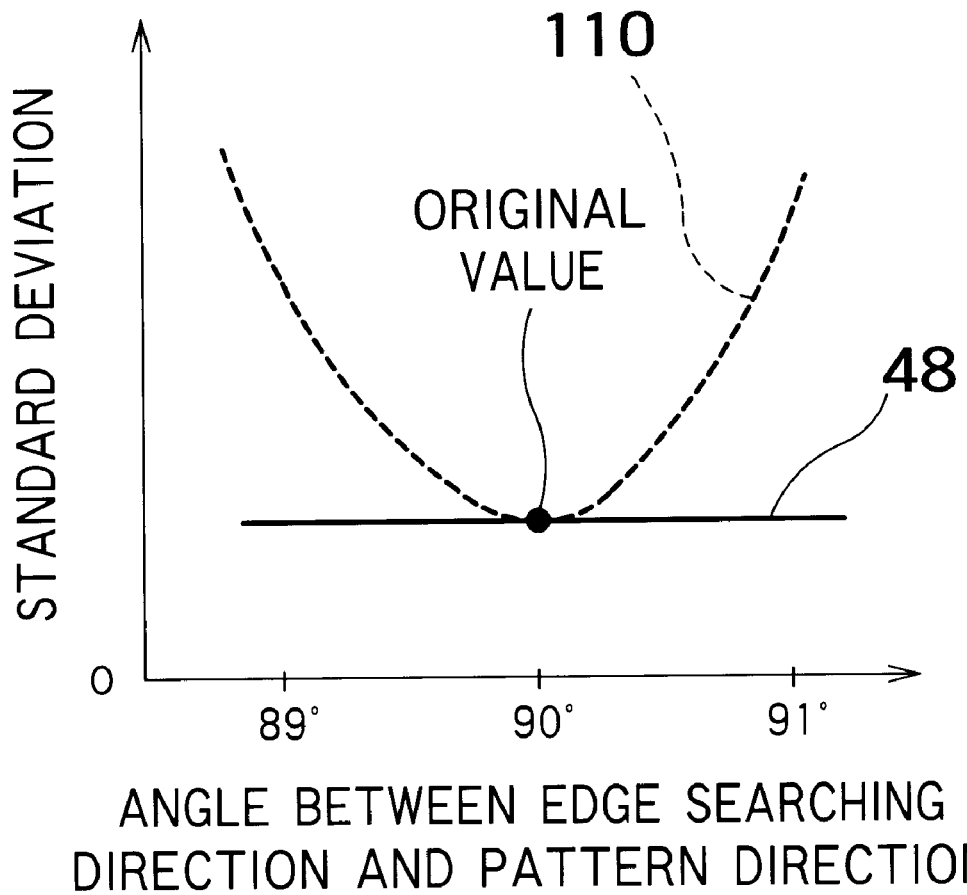
FIG. 7 is a graph showing the precision of the quantitative expression obtained by the procedure shown in FIG. 2 in comparison with the prior art.

In order to verify the precision of the quantitative expression thus obtained, the longitudinal directions of the pattern P1 were intentionally rotated on a SEM image by an optional angle to acquire a plurality of images, and the above described series of procedures were carried out with respect to these images to calculate standard deviations. FIG. 7 is a graph showing the verified results thus obtained in comparison with the prior art. As shown in this figure, after the angle between the edge searching direction and the longitudinal directions of the pattern P1 was intentionally rotated from 90° by ±1° to be verified similar to the prior art, it was confirmed that, according to the method in this embodiment, a constant value was calculated independent of the angle of rotation of the pattern as shown by a graph 48 as contrasted to a graph 110 in the prior art which draws a downward parabola shown by the dotted line.

While the pattern P1 wherein both of the edges 42 and 44 on both sides are included in the region to be inspected has been described in this embodiment, the above described quantitative expression may be acquired with respect to a pattern wherein only an edge on one side appears on the CRT 26.

In addition, while the resist pattern has been used in this embodiment, the above described series of procedures may be applied to an image of a pattern observed in an optional process as well as to an image of a pattern after etching.

Furthermore, while the threshold method using the threshold of 50% of the signal intensity as the position of an edge has been used as a method for determining the position of an edge in this embodiment, the threshold should not be limited to 50%, but another value may be used. In place of the threshold method, a method for approximating a signal waveform in the vicinity of an edge to an optional function may be used, or a method for determining the position of an edge on the basis of an image which is binarized or ternarized by an image processing may be used. The above described points are the same in the second through fifth embodiment which will be described later.

Moreover, while the equation of the straight line has been obtained on the basis of the sequence of edge points using the above described expressions (1) through (4) in this embodiment, the present invention should not be limited thereto. For example, there may be used a method for calculating $\epsilon$ i of expression (5) by giving the value a of gradient and the value b of the y-intercept while sequentially varying them and for searching for the values of a and b until the sum of squares of $\epsilon$ i is minimum. In this case, if the gradient and the y-intercept are first calculated by the usual linear regression to be adopted as the initial values of a and b, the number of repeated calculations can be decreased.

(3) Second Embodiment of Pattern Evaluation Method

Figure 8:
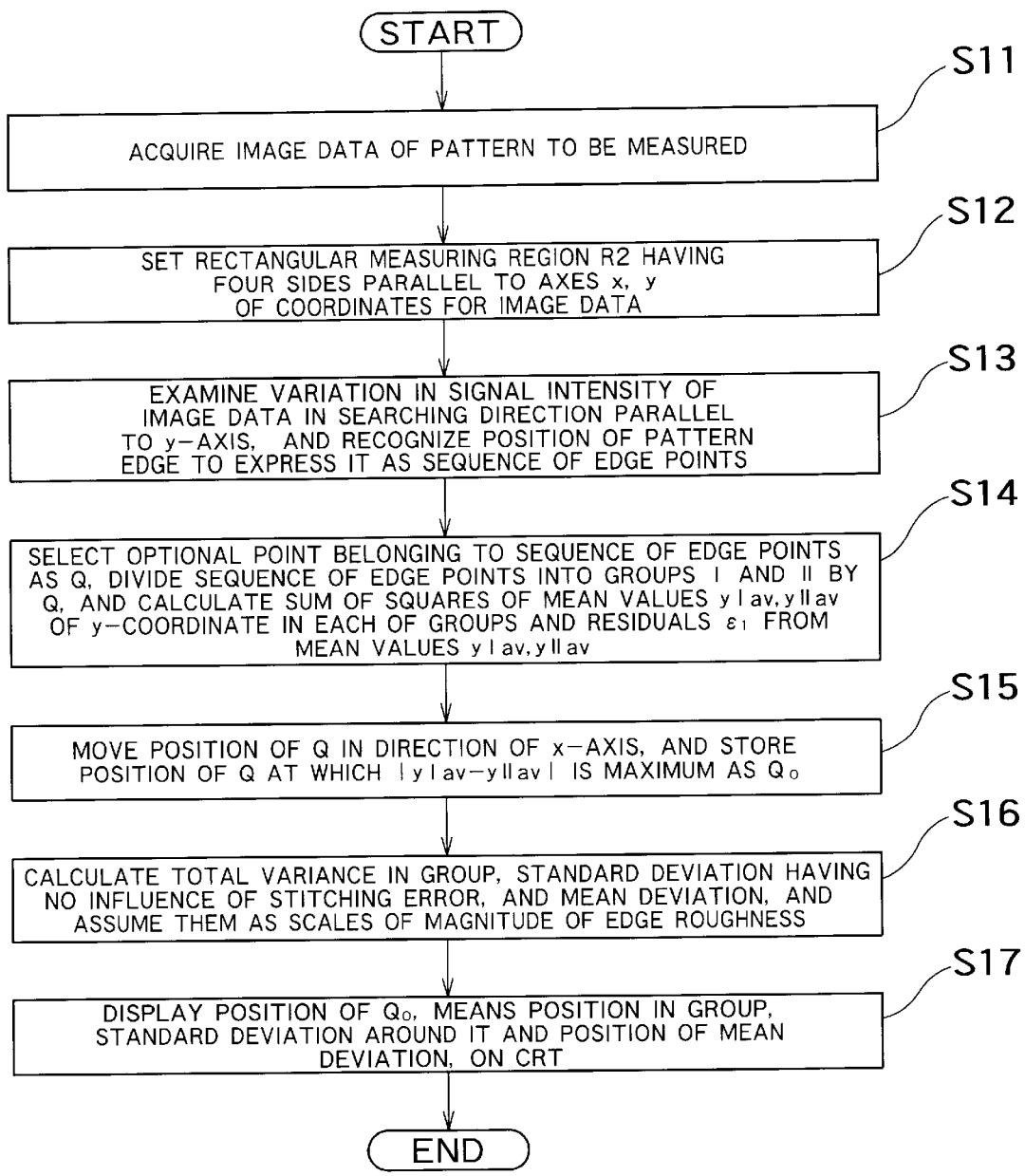
FIG. 8 is a flow chart showing a schematic procedure in a second embodiment of a pattern evaluation method according to the present invention.

FIG. 8 is a flow chart showing a schematic procedure in the second embodiment of a pattern evaluation method according to the present invention. In this figure, the procedure at steps 11 through 13 is substantially the same as those in the above described first embodiment, and ten is added to each of step numbers shown in FIG. 2. Therefore, steps different from the first embodiment will be mainly described below.

This embodiment is particularly suitable for a pattern wherein a stitching error occurs.

Figure 9:
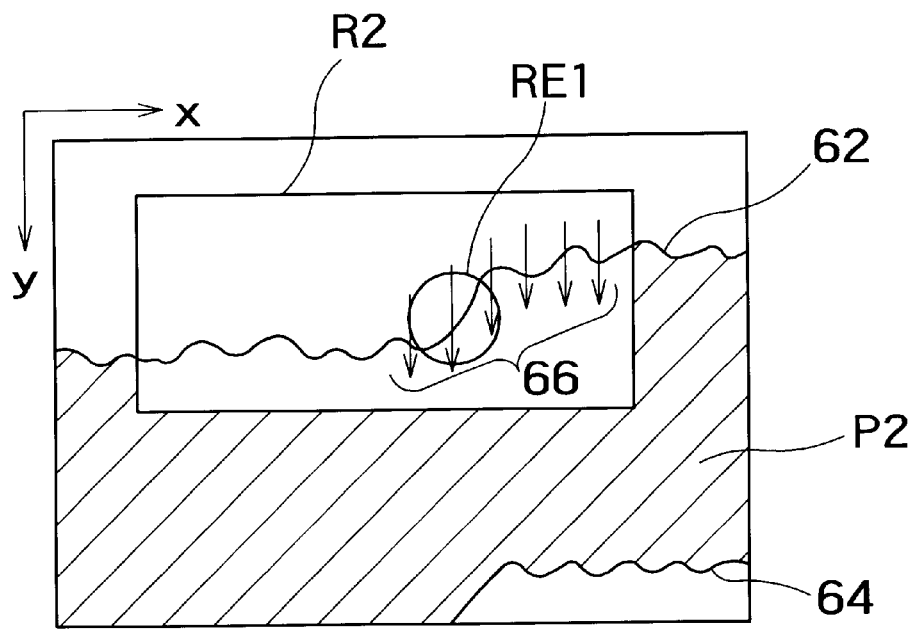
FIG. 9 is an illustration showing an example of a display of an image data acquired by the procedure shown in FIG. 8, and a region to be inspected.

First, the coordinates of an edge of a photoresist pattern to be evaluated are acquired by the same procedure as that in the above described first embodiment (steps S11 through S13). An example of a display of an image data acquired herein and a region to be inspected, on the CRT 26 is shown in FIG. 9. An edge 62 of a resist pattern P2 to be noticed shown in this FIG. is arranged so as to extend in a direction of x-axis, i.e., in a direction which is substantially horizontal with respect to the region to be inspected. A stitching error produced during the writing with a photomask appears in a portion RE1 of the pattern P2. In this embodiment, by examining the variation in signal intensity of the image data in a searching direction 66 which is parallel to y-axis, pattern edge positions are calculated with respect to a plurality of x-coordinate positions (step S13).

A sequence of edge points thus obtained is expressed by $Pi(xi, yi)$ (i=1, 2, ..., n (n is the total number of edge points)) by suffix i in order of the value of x-coordinate.

Figure 10:
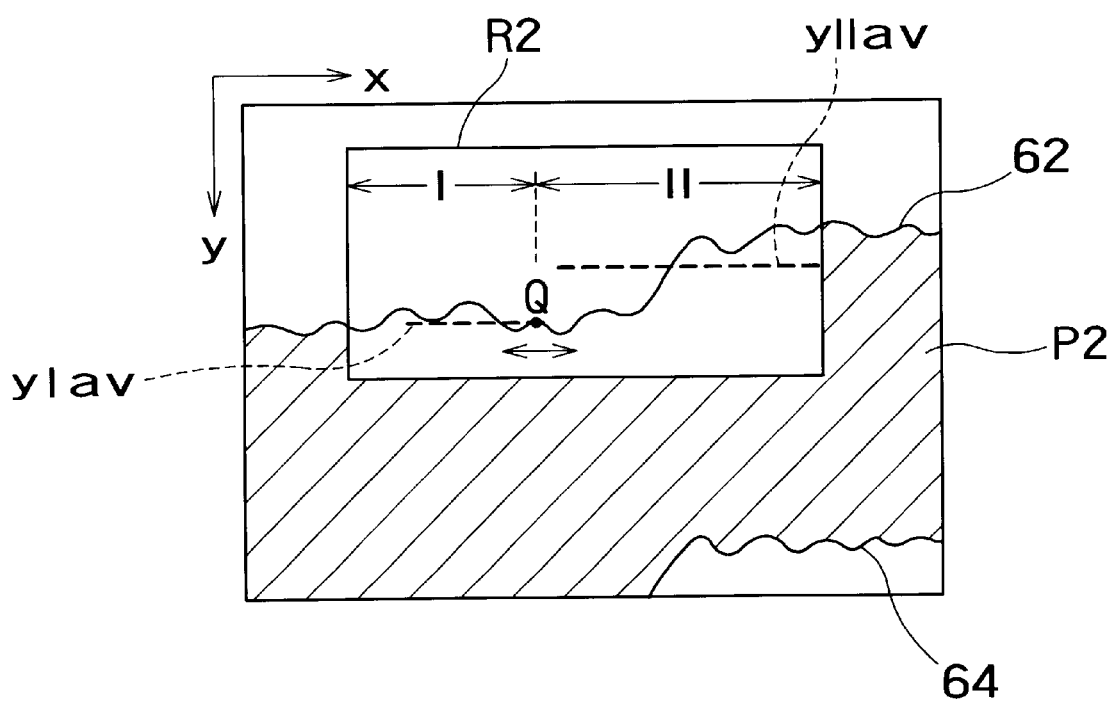
FIG. 10 is an illustration showing a sequence of edge points divided into two groups on both sides of an optional point Q on the sequence of edge points by the procedure shown in FIG. 8.

Then, as shown in FIG. 10, it is assumed that one point belonging to the sequence of points is Q, and Pi is divided into group I of the sequence of points having smaller x-coordinates than those of Q and group II of the sequence of points having greater x-coordinates than those of Q. In each group, the sum of squares of the mean value yIav, yIIav and the residuals $\epsilon$ ai from the mean value yIav, yIIav is calculated (step S14).

Figure 11:
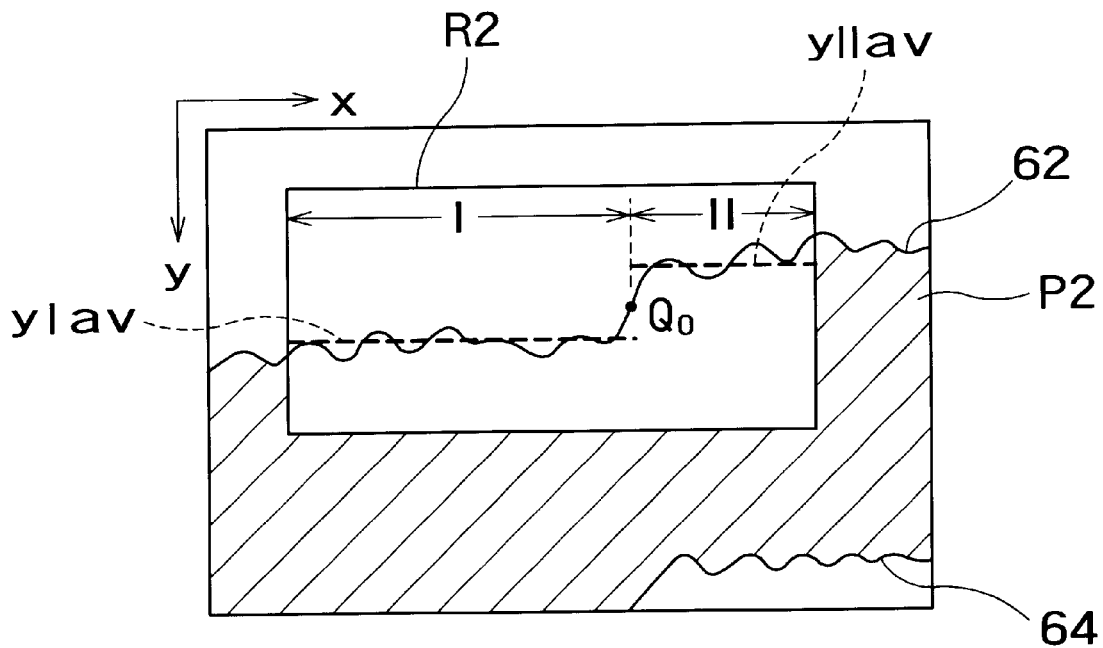
FIG. 11 is an illustration showing a point at which a stitching error defined by the procedure shown in FIG. 8 occurs.
Figure 12:
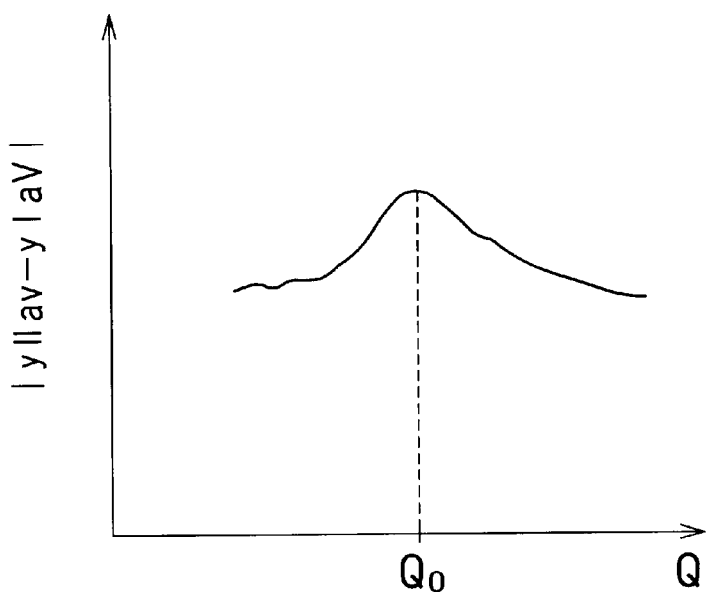
FIG. 12 is a graph showing the relationship between the difference between a mean value of group I and a mean value of group II and a point Q on the sequence of edge points.

Then, the above described position of Q is moved in a direction of x-axis, and as shown in FIG. 11, the position of Q wherein the difference between the mean value yIav of group I and the mean value yIIav of group II is the maximum is derived to be stored in the memory 24 as $Q_0$ (step S15). The relationship between Q and |yIav−yIIav| at step S15 is shown in FIG. 12. It can be also seen from this FIG. that the position $Q_0$ corresponds to the position at which the stitching error exists.

Then, using this result, the residuals $\epsilon$ ai in all of the groups are calculated, and the sum of squares of the residuals are divided by the total number N of data or (N−1) to calculate a total variance in the groups. By deriving its square root, a standard deviation having no influence of the stitching error is calculated, and a mean deviation is calculated from the total mean values of absolute values of the residuals $\epsilon$ ai in all of the groups. These values are adopted as scales of magnitude of edge roughness (step S16).

Finally, the position of $Q_0$, the means position in the groups, the standard deviation around it, and the position of the mean deviation, which are thus obtained, are displayed on the CRT 26 (step S17). Thus, it is possible to visually recognize roughness of the pattern to be measured, and the size and position of the stitching error.

Furthermore, the edges 62 and 64 on both sides of the pattern P2 used in this embodiment are not completely included in the region to be inspected. Therefore, if the prior art is used, it is not possible to remove the influence of the stitching error, so that edge roughness is overestimated.

Figure 13:
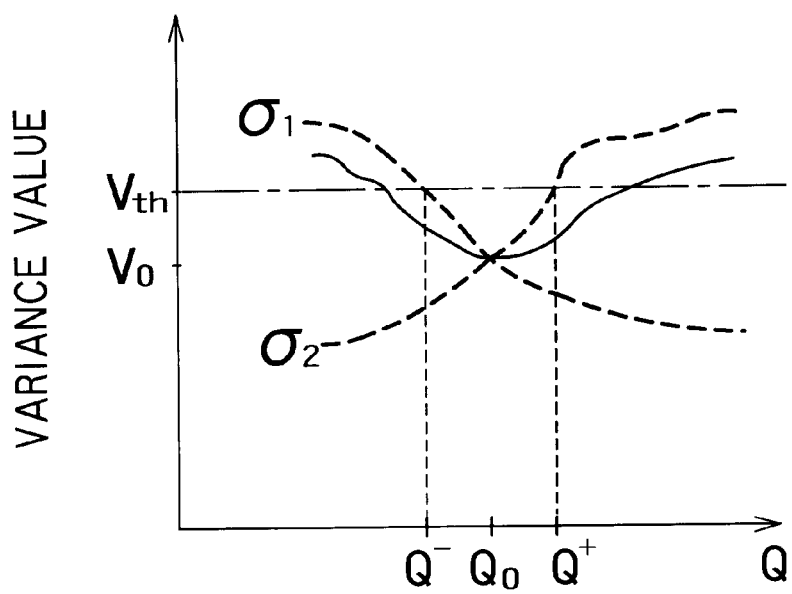
FIG. 13 is a graph showing another method for defining the position at which a stitching error occurs.
Figure 14:
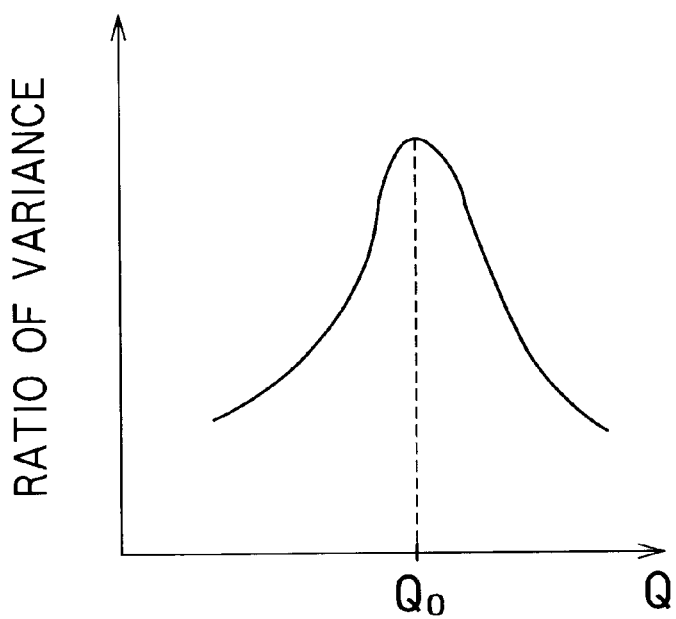
FIG. 14 is a graph showing a further method for defining the position at which a stitching error occurs.

In this embodiment, the position at which the stitching error occurs is determined so that the difference between means positions of every group is the maximum. However, in place of this method, as shown in FIG. 13, the position at which the stitching error occurs may be defined as a position at which the total variance in the groups is the minimum. Alternatively, as shown in FIG. 14, the ratio of the variance of mean values in two groups to the total variance in the groups may be calculated, and the position at which the stitching error occurs may be defined as a position at which the calculated ratio is the maximum. The manner of grouping used in this embodiment applies a manner called discriminant analysis in multivariate analysis. As can be seen from the comparison between FIGS. 12, 13 and 14, the above described three manners of grouping gave the same results in a range of errors of measurement.

Figure 15:
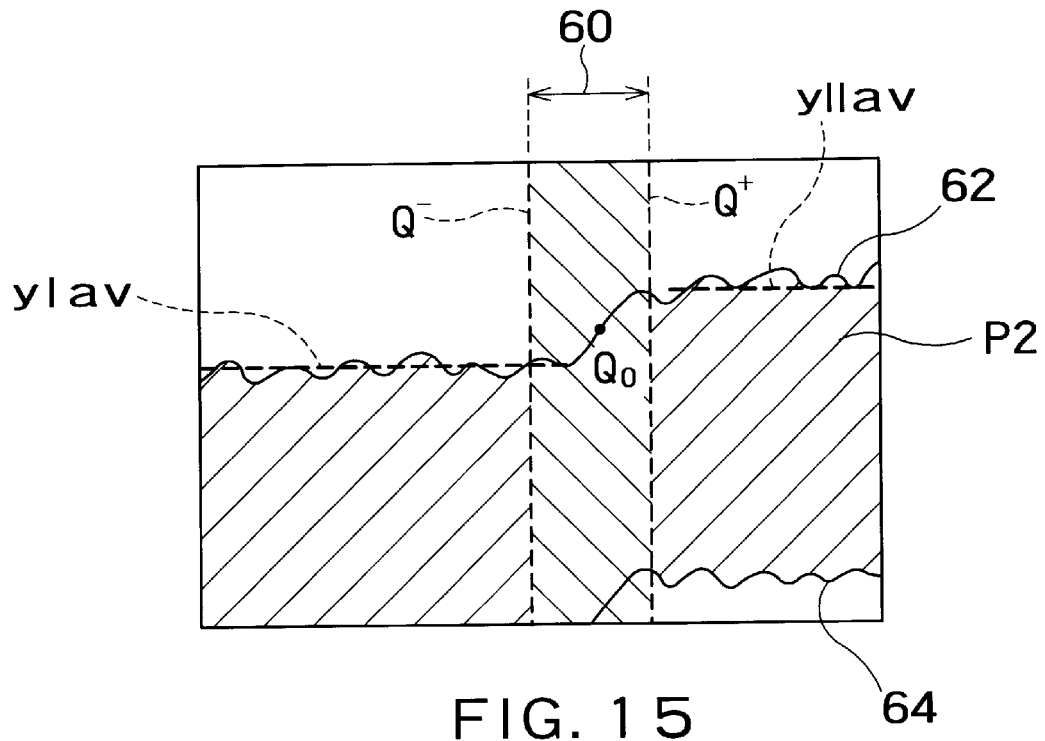
FIG. 15 is an illustration showing an example of a display of an non-analytic section ($Q^-$, $Q^+$) which is obtained by the method shown in FIG. 13 and which is not to be analyzed.

Moreover, if the fluctuation in means position due to the stitching error extends over a relatively wide range, the state of the fluctuation around $Q_0$ of the variance in the groups may be examined by the manner shown in FIG. 13, and a region in which the variance in each group rapidly varies may be excluded from an object to be analyzed. For example, a value obtained by adding an upper estimated section of variance, which is given from a $\chi$ square distribution table, to a variance value $V_0$ in $Q_0$ may be used as a threshold Vth to calculate the positions of $Q^-$ and $Q^+$ in FIG. 13 to exclude a section $(Q^-, Q^+)$ from an object to be analyzed, and then, values for quantitatively expressing edge roughness may be calculated. Moreover, if the section $(Q^-, Q^+)$ is displayed on the CRT 26 as shown in FIG. 15, information can be given to the evaluator as to which range is influenced by the stitching error.

(4) Third Embodiment of Pattern Evaluation Method

Figure 17:
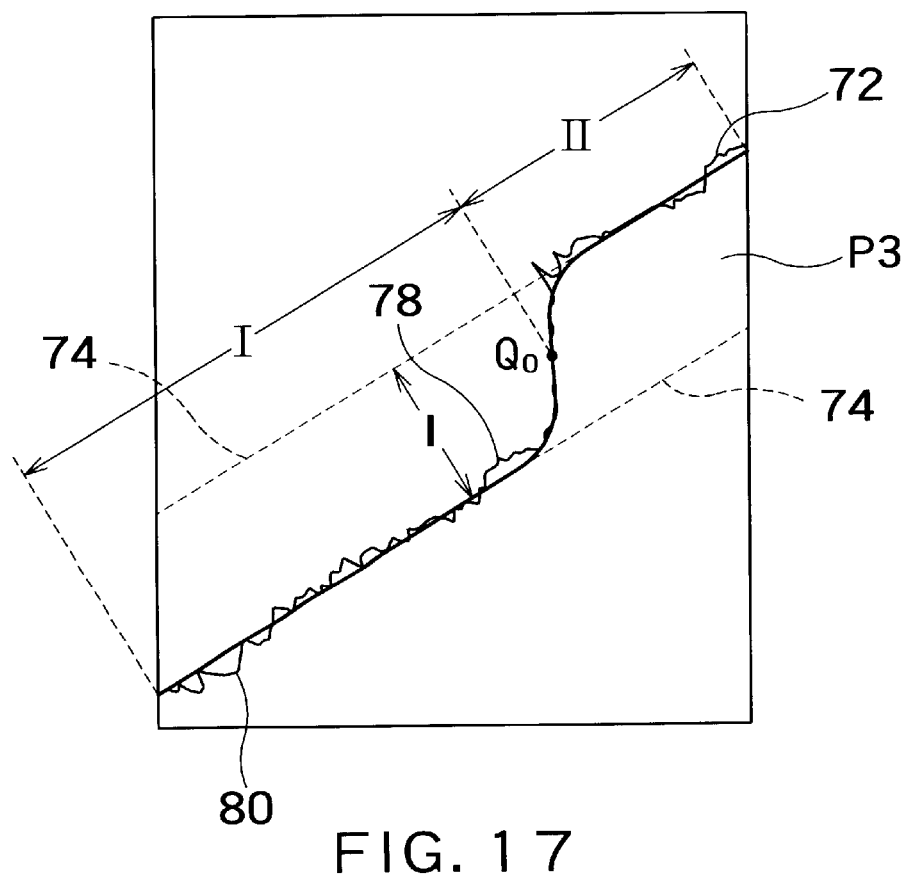
FIG. 17 is an illustration showing a point at which a stitching error defined by the procedure shown in FIG. 16 occurs.
Figure 16:
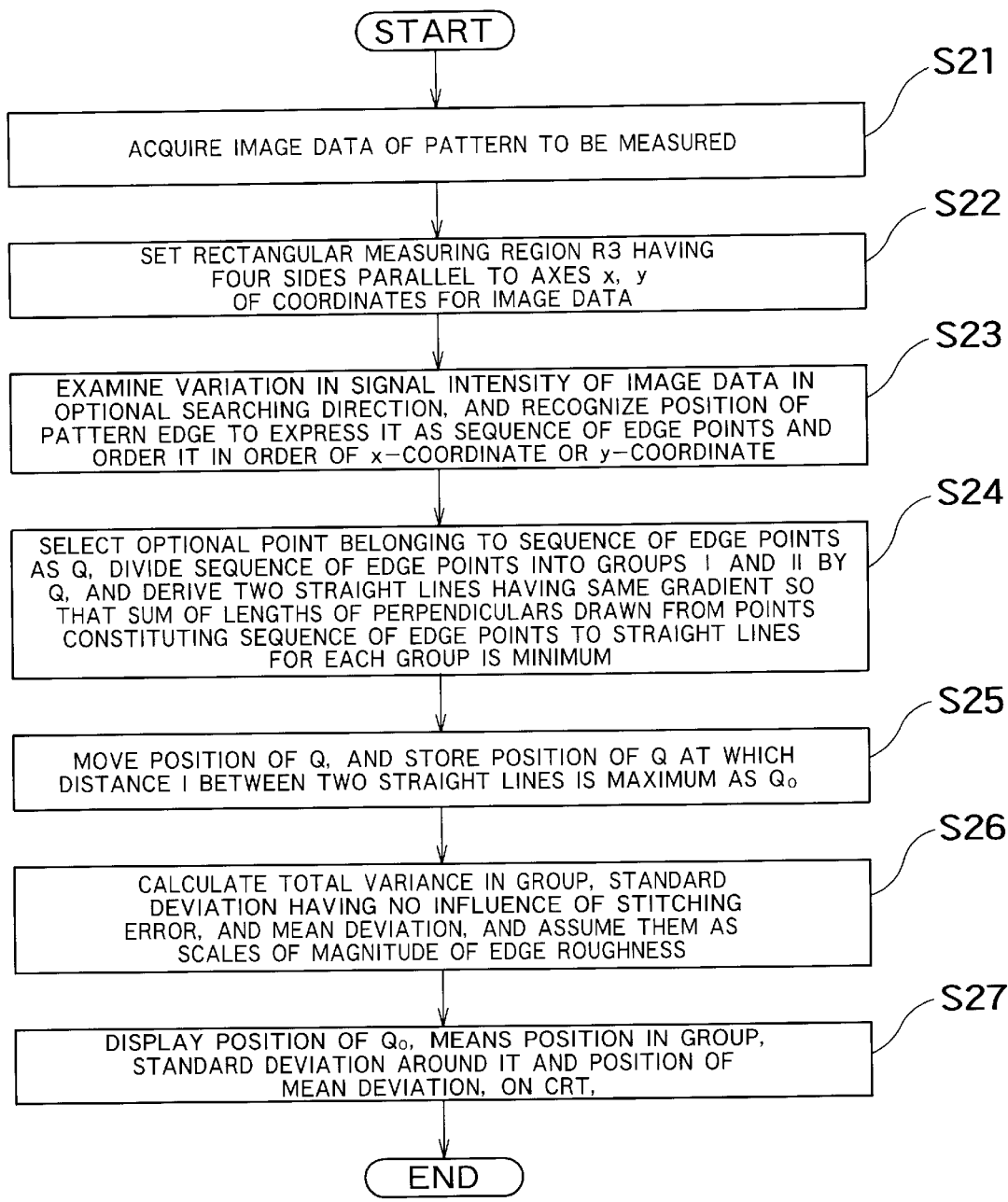
FIG. 16 is a flow chart showing a schematic procedure in a third embodiment of a pattern evaluation method according to the present invention.

FIG. 16 is a flow chart showing a schematic procedure in the third embodiment of a pattern evaluation method according to the present invention. The evaluation method in this embodiment is preferably used when the pattern edge of a pattern P3 to be measured is directed in an optional direction as shown in FIG. 17.

First, the coordinates of an edge of a photoresist pattern P3 to be evaluated are acquired by a procedure which is substantially the same as that in the above described first embodiment and are expressed as a sequence of points Pi (xi, yi) (i=1, 2, ..., n (n is the total number of edge points)) (steps S21 through S23). In this embodiment, the pattern edge is not parallel to x-coordinate or y-coordinate. Therefore, when the extracted sequence of edge points is grouped on both sides of an optional point Q, the sequences of points belonging to the respective groups I and II are approximated to two parallel and independent straight lines 72 and 74 as shown in FIG. 17 (step S24). Also in this case, after the sequence of edge points is ordered in order of x-coordinate or y-coordinate, the position of Q is given, and equations of two approximate straight lines 72 and 74 are calculated by the method described in the above described first embodiment on the condition that the gradients of the two straight lines are the same with respect to each of groups I and II.

Thereafter, in place of the difference between the mean positions in the above described second embodiment, the position of Q at which the distance 1 between the two straight lines 72 and 74 is the maximum is stored in the memory 24 as $Q_0$ (step S25). Then, a total variance in the groups is calculated by the same method as that in the second embodiment. By deriving its square root, a standard deviation having no influence of the stitching error is calculated, and a mean deviation is calculated from the total mean values of absolute values of the residuals $\epsilon$ bi in all of the groups. These values are adopted as scales of magnitude of edge roughness (step S26). Finally, the position of $Q_0$, the means position in the groups, the standard deviation around it, and the position of the mean deviation, which are thus obtained, are displayed on the CRT 26 (step S27).

In place of the use of the position at which the total variance in the groups is the minimum, in the method for defining the position at which the stitching error occurs, the variance of the lengths of perpendiculars drawn from the respective edge points to the approximate straight line in every group may be used for carrying out grouping.

After the pattern evaluation method in this embodiment was carried out with respect to an image data acquired by rotating a pattern by an optional angle from the scanning direction of the electron beams 12 as described in the first embodiment, it was confirmed that the obtained quantitative expression was coincident with that obtained in the second embodiment.

(5) Fourth Embodiment of Pattern Evaluation Method

The method in this embodiment is also effectively used when an edge pattern directed in an optional direction is acquired similar to the third embodiment.

Figure 18:
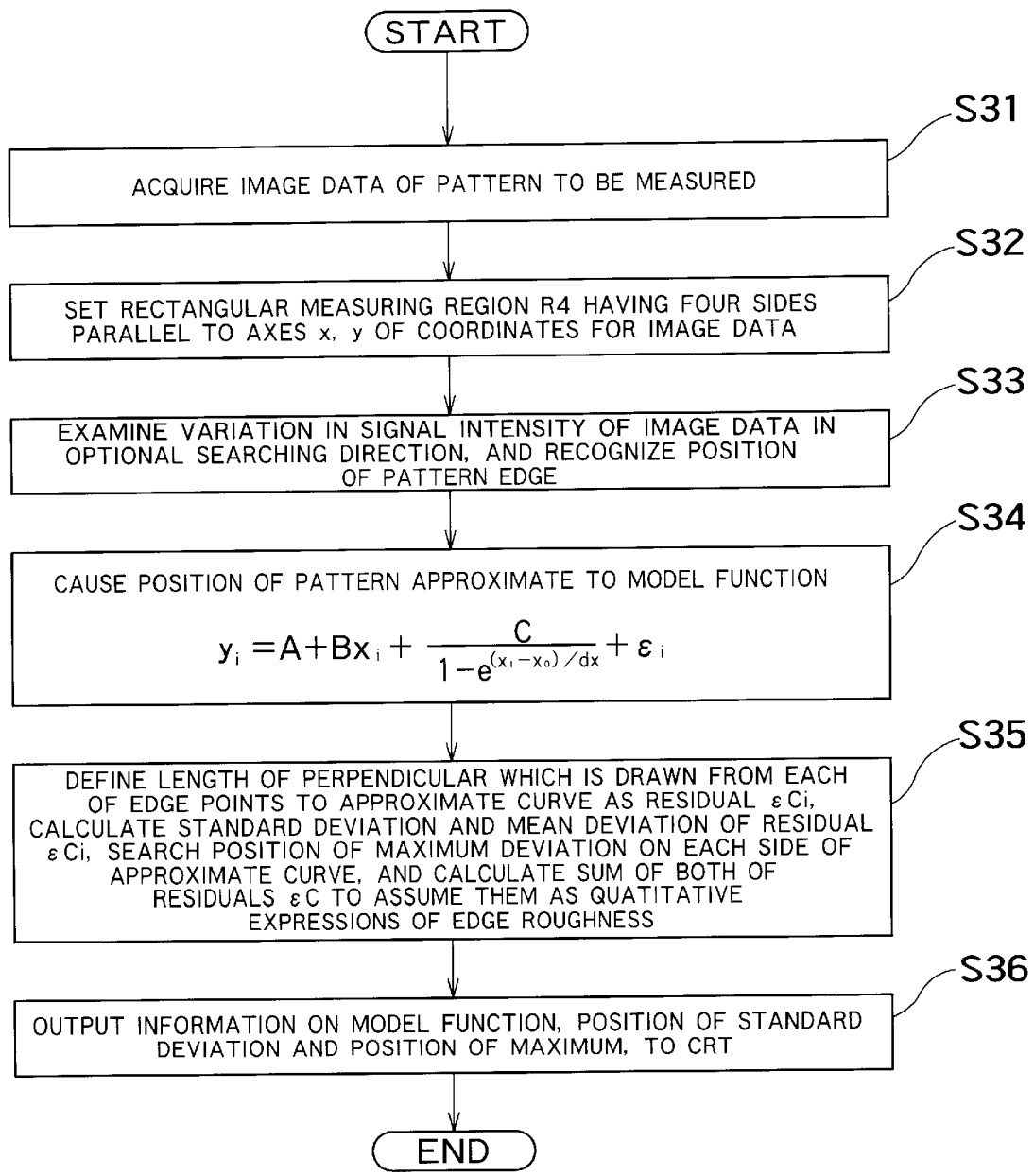
FIG. 18 is a flow chart showing a schematic procedure in a fourth embodiment of a pattern evaluation method according to the present invention.

FIG. 18 is a flow chart showing a schematic procedure of the pattern evaluation method in this embodiment. This preferred embodiment is characterized in that the coordinates of a pattern edge are directly approximated to a model function as shown at step S34 in FIG. 18.

First, the coordinates of an edge of a photoresist pattern to be evaluated are recognized similar to the above described embodiments (steps S31 through S33).

Then, the recognized coordinates of the pattern edge are approximated to a model function which is expressed by the following expression.

$$yi = A + Bxi + \frac{C}{1 - e^{(xi - x0)/dx}} + \varepsilon i \quad (6)$$

In the above described expression (6), the first and second terms on the right side are portions which express the rotation of the coordinates of the edge. The third term is the Boltzmann function which expresses the fluctuation in mean position due to a stitching error, and a function which goes away from the point of inflection ($x_0$, $y_0$) and which asymptotically approaches two parallel straight lines (y=0, y=C).

Each of coefficients A, B, C and $x_0$ on the right side of expression (6) can be determined by a method of non-linear least squares. In this embodiment, the coefficients are determined by the Rubenberg-Markert method.

Thereafter, a perpendicular is drawn from each of edge points to the approximate curve in expression (6), and its length is defined as a residual $\varepsilon$ Ci. Then, the standard deviation and mean deviation of the residual $\varepsilon$ Ci are calculated. In addition, the position of the maximum deviation, i.e., a point at which the residual $\varepsilon$ Ci is the maximum on each of both sides of the approximate curve in expression (6), is searched out. Then, the sum of both of the residual $\varepsilon$ Ci distances is calculated. It is assumed that these values are quantitative expressions of edge roughness of the pattern (step S35).

Finally, the calculated results, i.e., information on the model function, the position of the standard deviation, the position of the mean deviation, and the position of the maximum deviation is outputted to the CRT 26 (step S36).

Figure 19:
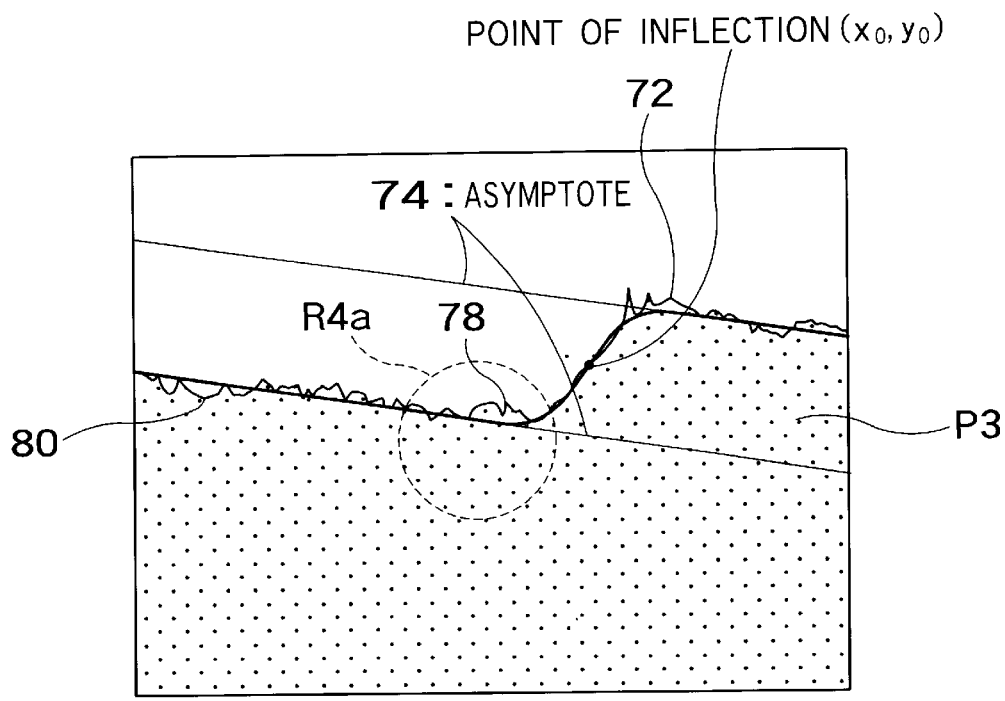
FIG. 19 is an illustration showing an example wherein a quantitative expression obtained by the procedure shown in FIG. 18 is displayed on a CRT.
Figure 20:
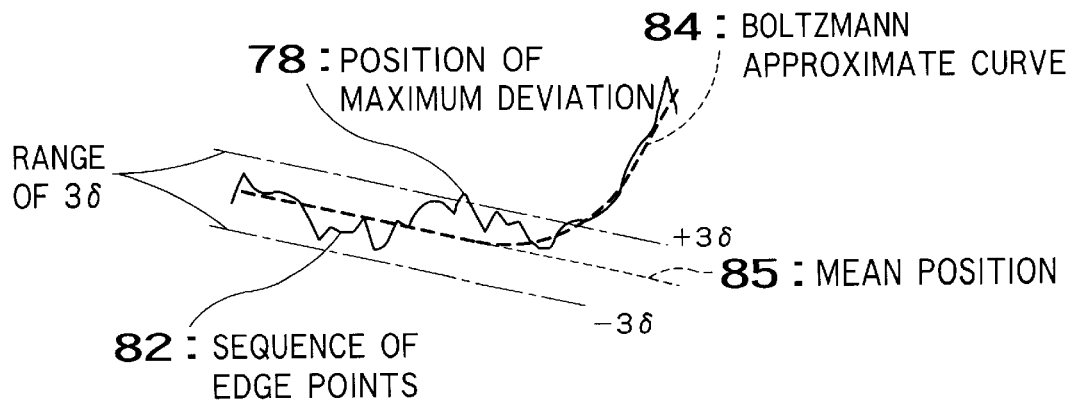
FIG. 20 is an enlarged view of a principal part in FIG. 19.

FIGS. 19 and 20 shows the results in the evaluation method in this embodiment which is applied to the pattern P3 shown in FIG. 17. FIG. 19 shows the whole inspected region of the pattern P3, and FIG. 20 is an enlarged view of region R4*a* in FIG. 19. In FIG. 20, a Boltzmann approximate curve 84 is the locus of the model function in the above described expression (6). A mean position 86 and positions 78 and 80 of the maximum deviation shown in both figure were also coincident with the results in the above described third embodiment, and the position of the point of inflection (x0, y0) shown in FIG. 19 was also coincident with the point $Q_0$ in the third embodiment.

In this embodiment, various methods can be adopted in order to apply the acquired coordinates of the edge to expression (6). For example, as a solving method of non-linear least squares, a well known routine, such as the Gaussian-Newton method, the simplex method or the Dabidon-Fretcher-Pawel method, or a suitable combination thereof may be used. Furthermore, all of these routines are optimizing methods based on repeated calculations, and the convergence in calculation depends on the initial values of coefficients, so that there are some cases where the calculations are not completed within a practical period of measuring time. In order to solve this problem, the above described method in the third embodiment may be first carried out to obtain equations of two straight lines to calculate coefficients A, B and C on the basis of the obtained equations of the two straight lines and to derive coefficient $x_0$ on the basis of the point $Q_0$ of the threshold for grouping, so that it is possible to obtain appropriate initial values.

(6) Fifth Embodiment of Pattern Evaluation Method

According to the above described evaluation methods in the second through fourth embodiments, grouping is always carried out on calculation with respect to data on any sequences of edge points, so that measurement is carried out with respect to a pattern originally having no stitching error as if a stitching error exists. As a result, the greatest component of roughness is excluded from calculation, so that there are some cases where the magnitude of roughness is underestimated.

Figure 21:
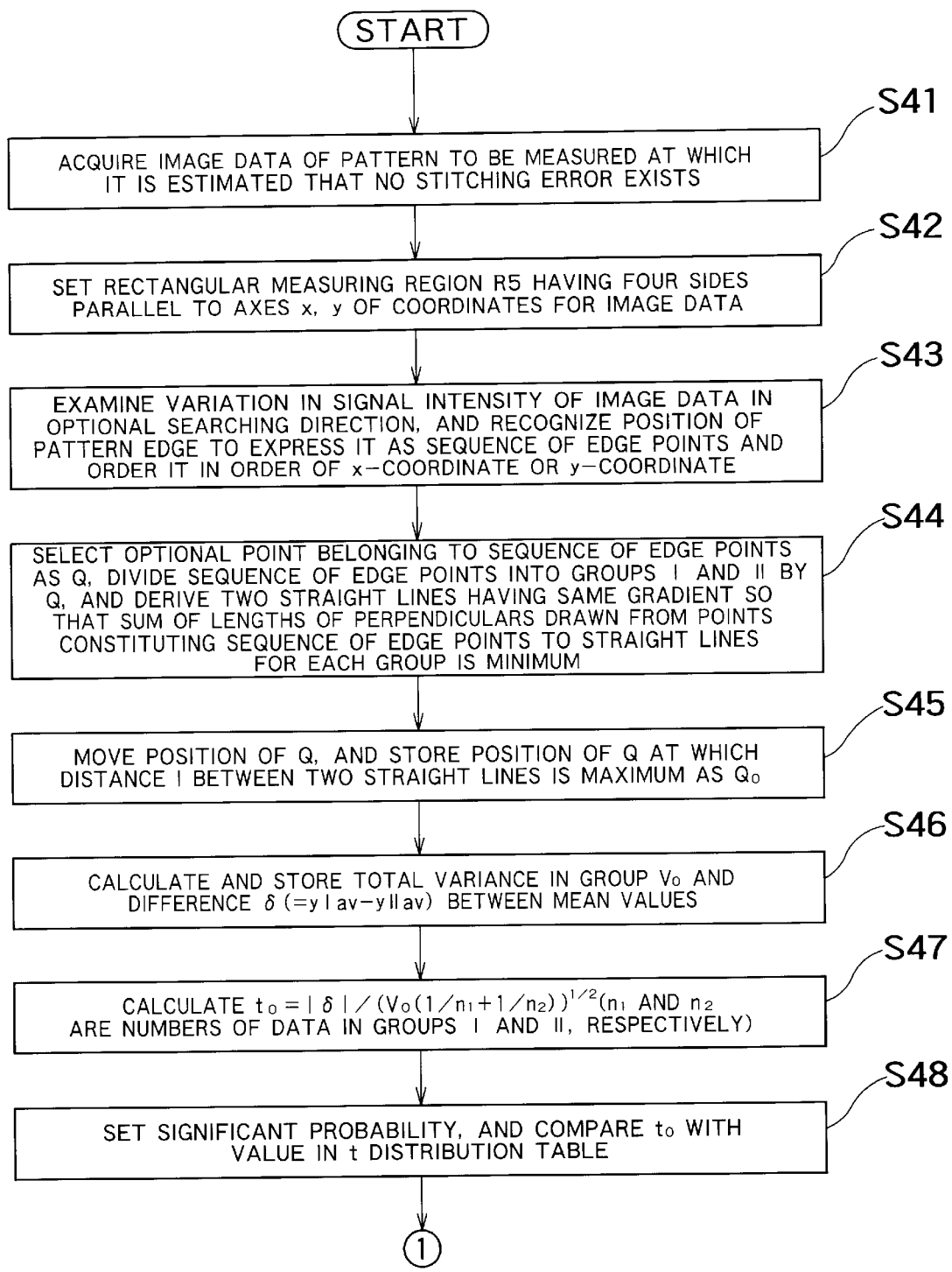
FIG. 21 and FIG. 22 are flow charts showing a schematic procedure in a fifth embodiment of a pattern evaluation method according to the present invention.
Figure 22:
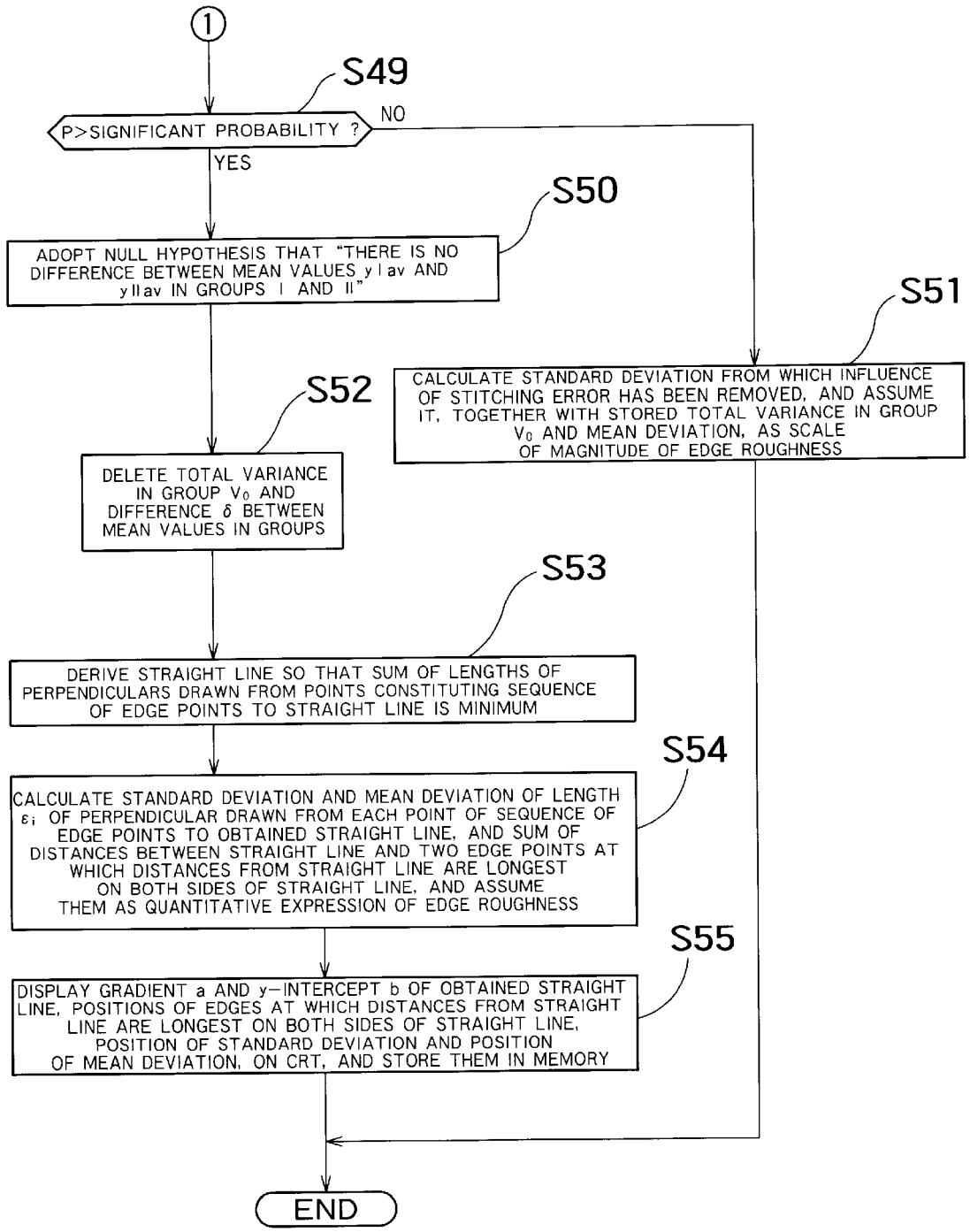
Figure 23:
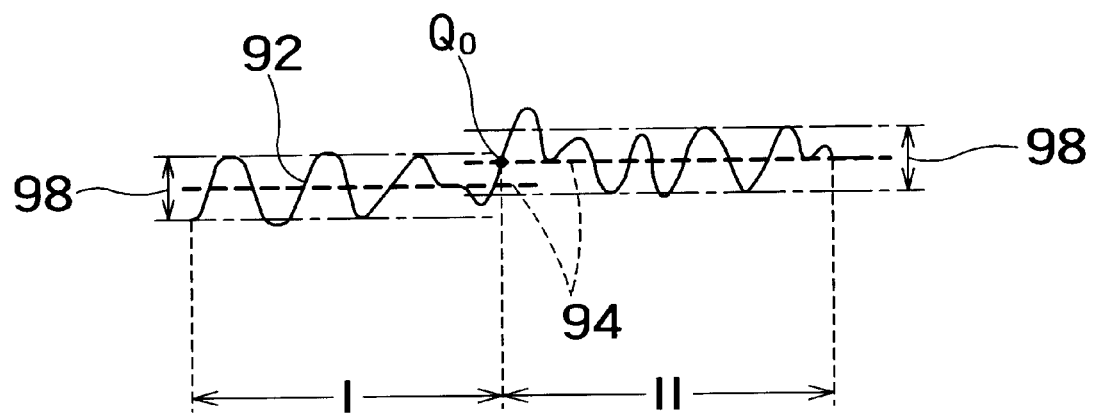
FIG. 23 is an illustration showing an example of a CRT display for explaining the procedure shown in FIGS. 21 and 22.
Figure 24:
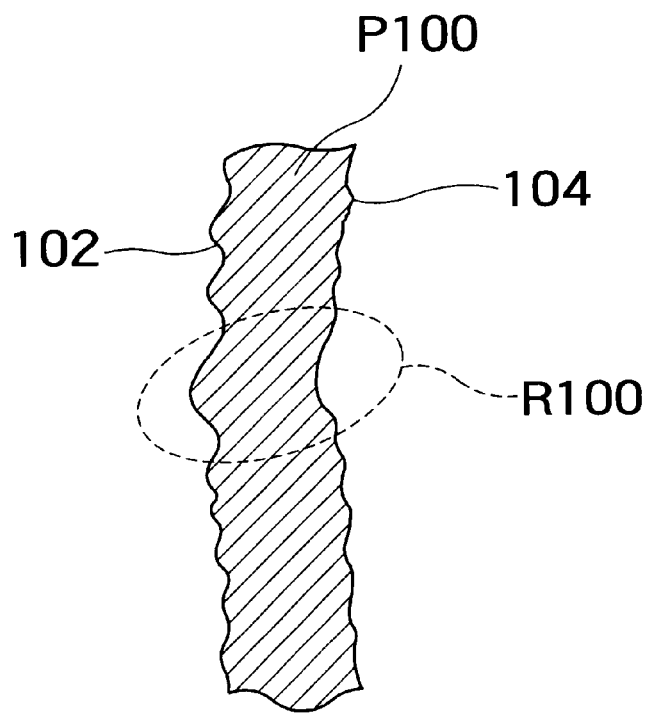
FIG. 24 is an illustration for explaining a problem in a conventional pattern evaluation method.

The fifth embodiment is intended to solve such a problem by carrying out the following statistical test. Referring to FIGS. 21 through 23, this embodiment will be described below. FIGS. 21 and 22 are flow charts showing a schematic procedure of the evaluation method in this embodiment.

First, as shown in FIG. 21, edge data of a pattern in which it is estimated that no stitching error exists is acquired (step S41). Then, the above described method in the third embodiment is used for carrying out a grouping process (steps S42 through S45). An example of the results of such a grouping is shown in FIG. 23. In this figure, reference number 98 denotes a value of standard deviation in each group with respect to the position of $Q_0$.

Then, a total variance in the groups $V_0$ and the difference $\delta$ (=yIav−yIIav) between mean values in the two groups I and II are calculated to be temporarily stored in the memory 24 (step S46). Thereafter, on the basis of the calculated total variance in the groups $V_0$ and the calculated difference $\delta$ between mean values in each group, and on the basis of the numbers $n_1$, and $n_2$ of data belonging to the groups I and II, respectively, the following quantity to is calculated (step S47).

$$t_0 = \frac{|\delta|}{\sqrt{V_0(1/n1 + 1/n2)}} \quad (7)$$

Since This $t_0$ accords with the t distribution of the degree of freedom $n_1+n_2-2$, it is possible to test whether $\delta$ is significantly different from 0 by comparing $t_0$ with the value in the t distribution table.

That is, a significant probability is preset, and the calculated $t_0$ is compared with the value in the t distribution table (step S48). In this embodiment, the significant probability was set to be 0.05.

Then, referring to FIG. 22, the set significant probability is compared with the value P in the distribution table (step S49). In this embodiment, P>0.05, so that there is adopted a null hypothesis that "there is no difference between the mean values yIav and yIIav in the two groups I and II" (step S50). According to this result, a working hypothesis that "the sequence of edge points is divided into two groups having difference mean positions" is not accepted, and data on the total variance in the groups $V_0$ and the difference $\delta$ between mean values in each group, which have been stored once in the memory 24, are deleted (step S52). Thereafter, the quantitative expression of edge roughness is carried out by the above described method in the first embodiment (steps S53, S54). Furthermore, if P is less than the preset significant probability (step S49), a standard deviation having no influence of the stitching error is calculated in accordance with the above described procedure in the third embodiment. The calculated standard deviation together with the total variance in the groups $V_0$ and the mean deviation which have been stored in the memory 24 is used as a scale of magnitude of edge roughness (step S51).

(7) Embodiment of Recorded Medium

In the foregoing five embodiments, the pattern evaluation methods are described as operation of the pattern evaluation system shown in FIG. 1 in accordance with the inspection recipe. However, the series of procedures described in these embodiments should not be limited to procedures capable of being executed by dedicated systems and may be stored in a recordable medium, such as a floppy disk or a CD-ROM, as a program, which is to be executed by an external general purpose computer, to be read by the computer to which a general purpose SEM inspection system is connected or to which an image data is supplied. Thus, a pattern evaluation method according to the present invention can be realized by means of an external server or a stand-alone general purpose computer. The recorded medium should not be limited to a portable recorded medium, such as a magnetic disk or an optical disk, but it may be a fixed recorded medium, such as a hard disk drive or a memory. In addition, a program including a series of procedures in the above described pattern evaluation method may be distributed via a communication line (including radio communication) such as Internet. Moreover, a program including a series of procedures in the above described pattern evaluation method may be enciphered, modulated or compressed to be distributed via a wire or radio line, such as Internet, or may be housed in a recordable medium to be distributed.

As described above in detail, according to the above described embodiments, it is possible to precisely quantify edge roughness regardless of the shape of arrangement of a pattern to be measured and regard less of the presence of stitching errors.

While the embodiments of the present invention have been described above, the present invention should not be limited to the above described embodiments, but the invention can be modified in various ways without departing from the principle of the invention. While the above described pattern evaluation system has been provided with the CRT and the memory for storing the evaluation recipe, the present invention should not be limited thereto. For example, the CRT may be connected to the above described external server or stand-alone computer to supply data of an image pattern from a SEM body to the CRT via the server or computer to process the data. As for the display of the image data on the CRT, as is shown in the above described relationship between FIGS. 19 and 20, the working efficiency in evaluation measurement can be further improved if the CRT or control computer has the function of enlarging display. Moreover, while the SEM image acquired from a CDSEM or a FEM has been picked up as the image of the evaluation pattern in the above described embodiments, the present invention should not be limited thereto. For example, of course, the present invention can be applied to an optical image acquired by a general optical image pick-up device.

What is claimed is:

1. A pattern evaluation method comprising:
    scanning an object to be measured on which a pattern has been formed with an energy beam and obtaining an image data of the object by detecting a scattered particle which is produced from the object;
    recognizing at least one edge of the pattern on the basis of said image data and calculating the coordinate positions of each edge point of a sequence of edge points constituting the shape of the edge of the pattern;
    deriving a straight line so that the sum of lengths of perpendiculars drawn from the edge points to said straight line is minimum; and
    statistically processing said lengths of perpendiculars when said straight line is derived and outputting evaluation information for quantitatively expressing roughness of the edge of the pattern.

2. A pattern evaluation method according to claim 1, which further comprises dividing said sequence of edge points into two groups by an optional point in said sequence of edge points to carry out a statistical test on the basis of information on said coordinate positions of edge points belonging to each of said groups to determine the presence of a statistically significant difference between said two groups,
    wherein deriving said straight line is carried out when it is determined that no statistically significant difference exists.

3. A pattern evaluation method according to claim 1, wherein said evaluation information includes a standard deviation of said lengths of perpendiculars when said straight line is derived and a mean deviation of said lengths of perpendiculars when said straight line is obtained.

4. A pattern evaluation method according to claim 3, which further comprises acquiring relative position information regarding which side of both sides of said derived straight line each of the edge points belongs to,
    wherein said evaluation information includes at least one maximum value of the lengths of perpendiculars of maximum values on both sides of said derived straight line, the perpendiculars being drawn from the edge points to said derived straight line.

5. A pattern evaluation method comprising:
    scanning an object to be measured on which a pattern has been formed with an energy beam and obtaining an image data of the object by detecting a scattered particle which is produced from the object;
    recognizing at least one edge of the pattern on the basis of said image data and calculating the coordinate positions of each edge point of a sequence of edge points constituting the shape of the edge of the pattern;
    dividing said sequence of edge points into two groups by an optional point in said sequence of edge points to identify an edge point at which a stitching error may occur by a discriminant analysis method in a multivariate analysis;
    calculating a mean position of the edge points in each of said groups and a residual from said mean position for each of said groups divided by the identified edge point; and
    statistically processing said residue and outputting evaluation information for quantitatively expressing roughness of the edge of the pattern.

6. A pattern evaluation method according to claim 5, wherein said evaluation information includes a standard deviation and a mean deviation, the influence of said stitching error being removed from said standard deviation.

7. A pattern evaluation method comprising:
   scanning an object to be measured on which a pattern has been formed with an energy beam and obtaining and incorporate an image data of the object by detecting a scattered particle which is produced from the object;
   recognizing at least one edge of the pattern on the basis of said image data and calculating the coordinate positions of each edge point of a sequence of edge points constituting the shape of the edge of the pattern;
   dividing said sequence of edge points into two groups by an optional point in said sequence of edge points to derive a straight line for each of said groups so that the sum of lengths of perpendiculars drawn from the edge points to said straight line is minimum to calculate the distance between said straight lines and identifying said optional point at which the distance between said straight lines is minimum as an edge point at which a stitching error may occur;
   calculating a length of a perpendicular which is drawn from each of the edge points to said straight line for each of said groups when the edge point at which a stitching error may occur is identified; and
   statistically processing said lengths of perpendiculars for each of said groups and outputting evaluation information for quantitatively expressing roughness of the edge of the pattern.

8. A pattern evaluation method according to claim 7, wherein said evaluation information includes a standard deviation of said lengths of perpendiculars and a mean deviation of said lengths of perpendiculars.

9. A pattern evaluation method according to claim 7, which further comprises carrying out a statistical test on the basis of information on said coordinate positions of edge points belonging to said two groups to determine the presence of a statistically significant difference between said two groups,
   wherein identifying the edge point at which the stitching error may occur is carried out when it is determined that a statistically significant difference exists.

10. A pattern evaluation method according to claim 7, which further comprises acquiring relative position information regarding which side of both sides of said derived straight line each of the edge points belongs to,
   wherein said evaluation information includes at least one maximum value of the lengths of perpendiculars of maximum values on both sides of said derived straight line, the perpendiculars being drawn from the edge points to said derived straight line.

11. A pattern evaluation method comprising:
   scanning an object to be measured on which a pattern has been formed with an energy beam and obtaining an image data of the object by detecting a scattered particle which is produced from the object;
   recognizing at least one edge of the pattern on the basis of said image data, and calculating the coordinate positions of each edge point of a sequence of edge points constituting the shape of the edge of the pattern;
   deriving a function on the basis of said coordinate positions, said function being approximate to said sequence of edge points and being expressed by a linear combination of a Boltzmann function and a linear function;
   dividing said sequence of edge points into first and second groups by a point of inflection of said function to calculate the length of a perpendicular drawn from each of the edge points to a curve which is a locus of said function for each of said first and second groups; and
   statistically processing the length of said perpendicular to output evaluation information for quantitatively expressing roughness of the edge of the pattern.

12. A pattern evaluation method according to claim 11, wherein said evaluation information includes a standard deviation of the lengths of said perpendiculars and a mean deviation of the lengths of said perpendiculars.

13. A pattern evaluation method according to claim 11, which further comprises carrying out a statistical test on the basis of information on said coordinate positions of edge points which are divided into said first and second groups and determining the presence of a statistically significant difference,
   wherein calculating the length of said perpendicular for each of said first and second groups is carried out when it is determined that said statistically significant difference exists between said first and second groups.

14. A pattern evaluation method according to claim 11, which further comprises acquiring relative position information regarding which side of both sides of said curve each of the edge points belongs to,
   wherein said evaluation information includes at least one of maximum values of the lengths of the perpendiculars on both sides of said curve.

15. A pattern evaluation system comprising:
   an image data acquiring part which scans an object to be measured on which a pattern has been formed with an energy beam, detects a scattered particle which is produced from said object and acquires an image data including at least one pattern edge;
   an operator part which recognizes the pattern edge on the basis of said image data, calculates the coordinate position of each of edge points of a sequence of edge points constituting the shape of the pattern edge, derives a straight line so that the sum of lengths of perpendiculars drawn from the edge points to said straight line is minimum and outputs the lengths of the perpendiculars when said straight line is obtained; and
   a statistically processing part which statistically processes the lengths of the perpendiculars when said straight line is obtain and outputs evaluation information for quantitatively expressing roughness of the pattern edge.

16. A pattern evaluation system according to claim 15, which further comprises a statistical test part which receives information on said coordinate position of each of the edge points from said operator part, divides said sequence of edge points into two groups by an optional point in said sequence of edge points and carries out a statistical test to determine the presence of a statistically significant difference between said two groups,
   wherein said operator part derives said straight line so that the sum of the lengths of perpendiculars drawn from the edge points to said straight line is minimum when said statistical test part determines that no statistically significant difference exists and said operator part outputs the lengths of said perpendiculars when said straight line is obtained.

17. A pattern evaluation system according to claim 15, wherein said evaluation information includes a standard deviation of said lengths of perpendiculars when said straight line is derived and a mean deviation of said lengths of perpendiculars when said straight line is obtained.

18. A pattern evaluation system according to claim 15, wherein said operator part further outputs relative position information regarding which side of both sides of said derived straight line each of the edge points belongs to, and said evaluation information includes at least one of maximum values of the lengths of perpendiculars which are drawn from the edge points to said derived straight line on both sides of said straight line.

19. A pattern evaluation system according to claim 15, which further comprises a display part for displaying said image data and said evaluation information.

20. A pattern evaluation system comprising:

an image data acquiring part which scans an object to be measured on which a pattern has been formed with an energy beam, detects a scattered particle which is produced from said object and acquires an image data including at least one pattern edge;

an operator part which recognizes the pattern edge on the basis of said image data, calculates the coordinate position of a sequence of edge points constituting the shape of the pattern edge, divides said sequence of edge points into two groups by an optional point in said sequence of edge points to identify an edge point at which a stitching error may occur by a discriminant analysis method in a multivariate analysis and calculates a mean position of the edge points in each of said groups and a residual from said means position for each of groups divided by said identified edge point; and a statistically processing part which statistically processes said residue to output evaluation information for quantitatively expressing roughness of the pattern edge.

21. A pattern evaluation system according to claim 20, which further comprises a statistical test part which receives information on said coordinate positions of the edge points which are divided into said two groups from said operator part and carries out a statistical test to determine the presence of a statistically significant difference, wherein said operator part identifies an edge point at which said stitching error may occur when said statistical test part determines that said statistically significant difference exists.

22. A pattern evaluation system according to claim 20, wherein said evaluation information includes a standard deviation and a mean deviation, the influence of said stitching error being removed from said standard deviation.

23. A pattern evaluation system comprising:

an image data acquiring part which scans an object to be measured on which a pattern has been formed with an energy beam, detects a scattered particle which is produced from said object and acquires an image data including at least one pattern edge;

an operator part which recognizes the pattern edge on the basis of said image data, calculates the coordinate position of a sequence of edge points constituting the shape of the pattern edge, divides said sequence of edge points into two groups at an optional point in said sequence of edge points to derive a straight line for each of said groups so that the sum of lengths of perpendiculars drawn from the edge points to said straight line is minimum to calculate the distance between said straight lines, identifies an optional point at which said distance is minimum as an edge point which a stitching error may occur and calculates a length of a perpendicular which is drawn from each of the edge points to said straight line for each of said groups when said edge point at which the stitching error may occur is identified; and a statistically processing part which statistically processes said lengths of perpendiculars for each of said groups and outputs evaluation information for quantitatively expressing roughness of the pattern edge.

24. A pattern evaluation system according to claim 23, wherein said evaluation information includes a standard deviation of said lengths of perpendiculars and a mean deviation of said lengths of perpendiculars.

25. A pattern evaluation system comprising:

an image data acquiring part which scans an object to be measured on which a pattern has been formed with an energy beam, detects a scattered particle which is produced from said object and acquires an image data including at least one pattern edge;

an operator part which recognizes the pattern edge on the basis of said image data, calculates the coordinate position of a sequence of edge points constituting the shape of the pattern edge, derives a function on the basis of said coordinate positions, said function being approximate to said sequence of edge points and expressed by a linear combination of a Boltzmann function and a linear function, divides said sequence of edge points into first and second groups by a point of inflection of said function and calculates the length of a perpendicular which is drawn from each of the edge points to a curve which is a locus of said function for each of said first and second groups; and a statistically processing part which statistically processes the length of said perpendicular and outputs evaluation information for quantitatively expressing roughness of the pattern edge.

26. A pattern evaluation system according to claim 25, which further comprises a statistical test part which receives information on said coordinate positions of the edge points which are divided into said first and second groups from said operator part and carries out a statistical test to determine the presence of a statistically significant difference, wherein said operator part calculates the length of said perpendicular for each of said first and second groups when said statistical test part determines that said statistically significant difference exists between said first and second groups.

27. A pattern evaluation system according to claim 25, wherein said evaluation information includes a standard deviation of said lengths of perpendiculars and a mean deviation of said lengths of perpendiculars.

28. A pattern evaluation system according to claim 25, wherein said operator part outputs relative position information regarding which side of both sides of said curve each of the edge points belongs to, wherein said evaluation information includes at least one of maximum values of the lengths of perpendiculars on both sides of said curve.

29. A computer readable recorded medium for use in a pattern evaluation system having a computer which receives and processes an image data acquired by scanning an object to be measured on which a pattern has been formed with an energy beam and by detecting a scattered particle which is produced from the object, said medium having recorded a program for causing said computer to execute a pattern evaluation method, said method comprising:

recognizing at least one edge of the pattern on the basis of said image data and calculating the coordinate positions of each edge point of a sequence of edge points constituting the shape of the edge of the pattern;

deriving a straight line so that the sum of lengths of perpendiculars drawn from the edge points to said straight line is minimum; and statistically processing said lengths of perpendiculars when said straight line is derived and outputting evaluation information for quantitatively expressing roughness of the edge of the pattern.

30. A computer readable recorded medium according to claim 29, wherein said pattern evaluation method further comprises dividing said sequence of edge points into two groups by an optional point in said sequence of edge points to carry out a statistical test on the basis of information on said coordinate positions of edge points belonging to each of said groups to determine the presence of a statistically significant difference between said two groups in said pattern evaluation method deriving said straight line is carried out when it is determined that no statistically significant difference exists.

31. A computer readable recorded medium for use in a computer which receives and processes an image data acquired by scanning an object to be measured on which a pattern has been formed with an energy beam and by detecting a scattered particle which is produced from the object, said medium having recorded a program for causing said computer to execute a pattern evaluation method, said method comprising:

recognizing at least one edge of the pattern on the basis of said image data and calculating the coordinate positions of each edge point of a sequence of edge points constituting the shape of the edge of the pattern;

dividing said sequence of edge points into two groups by an optional point in said sequence of edge points to identify an edge point at which a stitching error may occur by a discriminant analysis method in a multivariate analysis;

calculating a mean position of the edge points in each of said groups and a residual from said mean position for each of said groups divided by the identified edge point; and statistically processing said residue and outputting evaluation information for quantitatively expressing roughness of the edge of the pattern.

32. A computer readable recorded medium according to claim 31, wherein said pattern evaluation method further comprises carrying out a statistical test on the basis of information on said coordinate positions of edge points belonging to said two groups to determine the presence of a statistically significant difference between said two groups and in said pattern evaluation method identifying the edge point at which the stitching error may occur is carried out when it is determined that a statistically significant difference exists.

33. A computer readable recorded medium for use in a computer which receives and processes an image data acquired by scanning an object to be measured on which a pattern has been formed with an energy beam and by detecting a scattered particle which is produced from the object, said medium having recorded a program for causing said computer to execute a pattern evaluation method, said method comprising:

recognizing at least one edge of the pattern on the basis of said image data and calculating the coordinate positions of each edge point of a sequence of edge points constituting the shape of the edge of the pattern;

dividing said sequence of edge points into two groups by an optional point in said sequence of edge points to derive a straight line for each of said groups so that the sum of lengths of perpendiculars drawn from the edge points to said straight line is minimum to calculate the distance between said straight lines and identifying said optional point at which the distance between said straight lines is minimum as an edge point at which a stitching error may occur;

calculating a length of a perpendicular which is drawn from each of the edge points to said straight line for each of said groups when the edge point at which a stitching error may occur is identified; and statistically processing said lengths of perpendiculars for each of said groups and outputting evaluation information for quantitatively expressing roughness of the edge of the pattern.

34. A computer readable recorded medium according to claim 33, wherein said pattern evaluation method further comprises carrying out a statistical test on the basis of information on said coordinate positions of edge points belonging to said two groups to determine the presence of a statistically significant difference between said two groups and in said pattern evaluation method identifying the edge point at which the stitching error may occur is carried out when it is determined that a statistically significant difference exists.

35. A computer readable recorded medium for use in a computer which receives and processes an image data acquired by scanning an object to be measured on which a pattern has been formed with an energy beam and by detecting a scattered particle which is produced from the object, said medium having recorded a program for causing said computer to execute a pattern evaluation method, said method comprising:

recognizing at least one edge of the pattern on the basis of said image data, and calculating the coordinate positions of each edge point of a sequence of edge points constituting the shape of the edge of the pattern;

deriving a function on the basis of said coordinate positions, said function being approximate to said sequence of edge points and being expressed by a linear combination of a Boltzmann function and a linear function;

dividing said sequence of edge points into first and second groups by the point of inflection of said function to calculate the length of a perpendicular drawn from each of the edge points to a curve which is a locus of said function for each of said first and second groups; and statistically processing the length of said perpendicular to output evaluation information for quantitatively expressing roughness of the edge of the pattern.

36. A computer readable recorded medium according to claim 35, wherein said pattern evaluation method further comprises carrying out a statistical test on the basis of information on said coordinate positions of edge points which are divided into said first and second groups and determining the presence of a statistically significant difference and in said pattern evaluation method calculating the length of said perpendicular for each of said first and second groups is carried out when it is determined that said statistically significant difference exists between said first and second groups.

* * * * *

UNITED STATES PATENT AND TRADEMARK OFFICE
CERTIFICATE OF CORRECTION

PATENT NO. : 6,839,470 B2
DATED : January 4, 2005
INVENTOR(S) : Ikeda

It is certified that error appears in the above-identified patent and that said Letters Patent is hereby corrected as shown below:

Title page,
Item [30], Foreign Application Priority Data, change "Jan. 27, 2000" to
-- November 27, 2000 --.

Signed and Sealed this

Fifteenth Day of March, 2005

JON W. DUDAS
*Director of the United States Patent and Trademark Office*